(12) United States Patent
Mihara

(10) Patent No.: US 9,831,092 B2
(45) Date of Patent: Nov. 28, 2017

(54) SEMICONDUCTOR DEVICE AND METHOD FOR MANUFACTURING THE SAME

(71) Applicant: RENESAS ELECTRONICS CORPORATION, Tokyo (JP)

(72) Inventor: Tatsuyoshi Mihara, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/061,870

(22) Filed: Mar. 4, 2016

(65) Prior Publication Data
US 2016/0293719 A1 Oct. 6, 2016

(30) Foreign Application Priority Data

Mar. 30, 2015 (JP) ................................. 2015-070152

(51) Int. Cl.
| | |
|---|---|
| *H01L 29/423* | (2006.01) |
| *H01L 21/28* | (2006.01) |
| *H01L 27/11573* | (2017.01) |
| *H01L 27/1157* | (2017.01) |

(52) U.S. Cl.
CPC .... *H01L 21/28282* (2013.01); *H01L 27/1157* (2013.01); *H01L 27/11573* (2013.01); *H01L 29/42344* (2013.01)

(58) Field of Classification Search
None
See application file for complete search history.

(56) References Cited

U.S. PATENT DOCUMENTS

| | | | |
|---|---|---|---|
| 7,245,531 B2 | 7/2007 | Okazaki et al. | |
| 7,863,131 B2 | 1/2011 | Yasui et al. | |
| 8,344,444 B2 * | 1/2013 | Kawashima | ...... H01L 21/28282 257/296 |
| 8,357,968 B2 * | 1/2013 | Chakihara | ......... H01L 21/28282 257/302 |
| 8,373,216 B2 | 2/2013 | Chakihara et al. | |
| 9,257,446 B2 * | 2/2016 | Arigane | ............ H01L 27/11568 |
| 9,520,504 B2 * | 12/2016 | Toba | ..................... H01L 29/792 |

(Continued)

FOREIGN PATENT DOCUMENTS

| | | |
|---|---|---|
| JP | 2006-049737 A | 2/2006 |
| JP | 2006-054292 A | 2/2006 |
| JP | 2011-222938 A | 11/2011 |

*Primary Examiner* — Abul Kalam
(74) *Attorney, Agent, or Firm* — McDermott Will & Emery LLP

(57) ABSTRACT

A semiconductor device includes a control gate electrode and a memory gate electrode which are formed over the main surface of a semiconductor substrate in a memory cell region, and a first electrode and a second electrode which are formed over the main surface of the semiconductor substrate in a shunt region. The first electrode is formed integrally with the control gate electrode, and the second electrode is formed integrally with the memory gate electrode. The second electrode includes a first section formed along the side wall of the first electrode, and a second section extending along the main surface of the semiconductor substrate. Also, the height of the upper surface of the first electrode with respect to the main surface of the semiconductor substrate is generally same to the height of the upper surface of the first section of the second electrode.

7 Claims, 23 Drawing Sheets

(56) References Cited

U.S. PATENT DOCUMENTS

| | | | |
|---|---|---|---|
| 2007/0164342 A1* | 7/2007 | Okazaki | H01L 21/28273 |
| | | | 257/314 |
| 2010/0078705 A1* | 4/2010 | Chakihara | H01L 21/28282 |
| | | | 257/324 |
| 2010/0200909 A1* | 8/2010 | Kawashima | H01L 21/28282 |
| | | | 257/326 |
| 2011/0095348 A1* | 4/2011 | Chakihara | H01L 21/28273 |
| | | | 257/298 |
| 2014/0239378 A1* | 8/2014 | Toba | H01L 29/792 |
| | | | 257/324 |

* cited by examiner

SEMICONDUCTOR DEVICE AND METHOD FOR MANUFACTURING THE SAME

CROSS-REFERENCE TO RELATED APPLICATIONS

The disclosure of Japanese Patent Application No. 2015-070152 filed on Mar. 30, 2015 including the specification, drawings and abstract is incorporated herein by reference in its entirety.

BACKGROUND

The present invention relates to a semiconductor device and a method for manufacturing the same, and can be suitably used for example for a semiconductor device including a non-volatile memory and a method for manufacturing the same.

As an electrically writable/erasable non-volatile semiconductor storage device, an EEPROM (Electrically Erasable and Programmable Read Only Memory) has been widely used. These storage devices represented by a flash memory widely used at present include an electro-conductive floating gate electrode surrounded by an oxidized film under a gate electrode of a MISFET or a trapping insulating film, and the electric charge storage state in the floating gate or the trapping insulating film is made the storage information which is read as a threshold value of the transistor. This trapping insulating film means an insulating film capable of storing the electric charge, and a silicon nitride film and the like can be cited as an example. By charging/discharging of the electric charge to/from such an electric charge storage region, the threshold value of the MISFET is shifted, and the MISFET is operated as a storage element. As the flash memory, there is a split gate type cell using a MONOS (Metal-Oxide-Nitride-Oxide-Semiconductor) film. In such memory, by using the silicon nitride film as the electric charge storage region, such advantages are provided of being excellent in reliability in holding data for discretely storing the electric charge compared to the electro-conductive floating gate film, being capable of thinning the oxide films over and below the silicon nitride film because of the excellent reliability in holding data, being capable of lowering the voltage of the writing/erasing operation, and so on.

Also, the memory cell includes a control gate electrode (selection gate electrode) that is formed over a semiconductor substrate through a first gate insulating film, a memory gate electrode that is formed over the semiconductor substrate through a second gate insulating film including an electric charge storage region, and a pair of semiconductor regions (a source region and a drain region) that are formed over the surface of the semiconductor substrate so as to sandwich the control gate electrode and the memory gate electrode. In the memory cell region, plural memory cells are disposed in a matrix shape in the X-direction and the Y-direction. For example, with respect to plural memory cells arrayed in a row in the Y-direction, the control gate electrode and the memory gate electrode are respectively formed integrally, and the control gate electrode and the memory gate electrode extend in the Y-direction. For example, the control gate electrode and the memory gate electrode comprised of a polycrystalline silicon film and the like extend to an electric supply region (shunt region) adjacent to the memory cell region, and are coupled there with a control gate line (selection gate line) and a memory gate line which are comprised of a metal wiring layer for example.

In Japanese Unexamined Patent Application Publication No. 2006-049737, Japanese Unexamined Patent Application Publication No. 2011-222938, and Japanese Unexamined Patent Application Publication No. 2006-054292, technologies on a shunt structure for coupling the control gate electrode with the control gate line and coupling the memory gate electrode with the memory gate line in the electric supply region are described.

SUMMARY

Also in the semiconductor device including a non-volatile memory, it is desired to improve the performance as much as possible, or to improve the reliability of the semiconductor device, or to achieve the both of them.

Other problems and new features will be clarified from the description of the present specification and the attached drawings.

According to an embodiment, a semiconductor device includes a semiconductor substrate that includes a memory cell region in the main surface of the semiconductor substrate and a shunt region that is adjacent to the memory cell region in a first direction of the main surface. Also, the semiconductor device includes a memory cell that is formed in the memory cell region, the memory cell including a first gate electrode that is formed over the main surface of the semiconductor substrate through a first gate insulating film and extends in the first direction, a second gate electrode that is adjacent to the first gate electrode and is formed over the main surface of the semiconductor substrate through a second gate insulating film, and a first source region and a first drain region that are formed over the main surface of the semiconductor substrate so as to sandwich the first gate electrode and the second gate electrode. Further, the semiconductor device includes a first electrode that is positioned in the shunt region and is formed integrally with the first gate electrode, and a second electrode that is positioned in the shunt region, is formed integrally with the second gate electrode, and includes a first section formed along the side wall of the first gate electrode and a second section extending from the first section along the main surface of the semiconductor substrate. Also, the semiconductor device includes a first insulating film that covers the first gate electrode, the second gate electrode, the first electrode, and the second electrode, an electro-conductive first plug and an electro-conductive second plug that are formed in the first insulating film with the first plug being coupled with the drain region and with the second plug being coupled with the second electrode, and a first metal wiring and a second metal wiring which are positioned over the first insulating film with the first metal wiring being coupled with the first plug and with the second metal wiring being coupled with the second plug. Further, with respect to the main surface of the semiconductor substrate, the height of the upper surface of the first electrode is generally same to the height of the upper surface of the first section of the second electrode.

According to the embodiment, the performance of the semiconductor device can be improved, or the reliability of the semiconductor device can be improved, or the both of them can be achieved.

DETAILED DESCRIPTION

Figure 1:
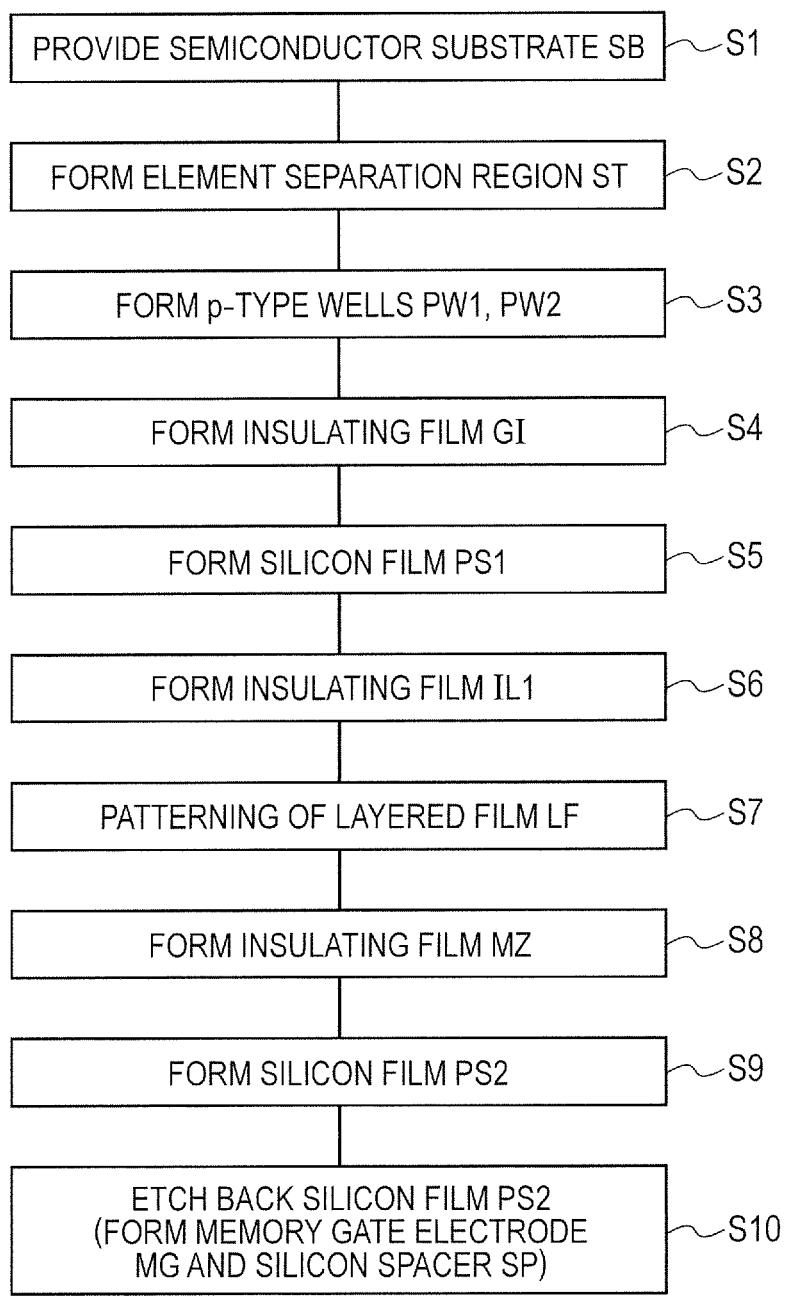
FIG. 1 is a process flowchart showing a part of the manufacturing step of a semiconductor device that is an embodiment.

In the embodiments below, when it is required for the sake of convenience, although description will be made dividedly into plural sections or embodiments, they are not unrelated to each other, and one has a relationship of a modification, detail, supplementary explanation and the like of a part or entirety with the other with the exception of a case particularly stated explicitly. Further, in the embodiments below, when the quantity of elements and the like (including the number of pieces, numerical value, amount, range and the like) are mentioned, they are not limited to the quantity mentioned and may be equal to or more than and equal to or less than the quantity mentioned with the exception of a case particularly specified explicitly, a case apparently limited to a specific quantity in principle, and so on. Further, in the embodiments below, it is needless to mention that the constituent elements thereof (also including the elemental step and the like) are not necessarily indispensable with the exception of a case particularly specified explicitly, a case considered to be apparently indispensable in principle, and so on. In a similar manner, in the embodiments below, when the shape, the positional relation and the like of a constituent element and the like are mentioned, they are to contain one that is substantially approximate or similar to the shape and the like thereof and so on with the exception of a case particularly specified explicitly, a case apparently considered not to be the case in principle, and so on. This fact also applies to the numerical value and the range described above.

Below, the embodiment will be explained in detail based on the drawings. Also, in all drawings for explaining the embodiment, a same reference sign will be given to a member having a same function, and repeated explanation thereon will be omitted. Further, in the embodiments below, explanation on a same or similar portions will not be repeated in principle except when it is particularly required.

Also, in the drawings used in the embodiment, there is also a case hatching is omitted even in a cross-sectional view in order to facilitate understanding of the drawing. Further, there is also a case hatching is given even in a plan view in order to facilitate understanding of the drawing.

Embodiment

<On Manufacturing Step of Semiconductor Device>

The semiconductor device of the present embodiment and embodiments below is a semiconductor device including a non-volatile memory (non-volatile storage element, flash memory, non-volatile semiconductor storage device). In the present embodiment and the embodiments below, the non-volatile memory will be explained based on a memory cell that is based on an n-channel type MISFET (MISFET: Metal Insulator Semiconductor Field Effect Transistor).

The method for manufacturing the semiconductor device of the present embodiment will be explained referring to the drawings.

Figure 2:
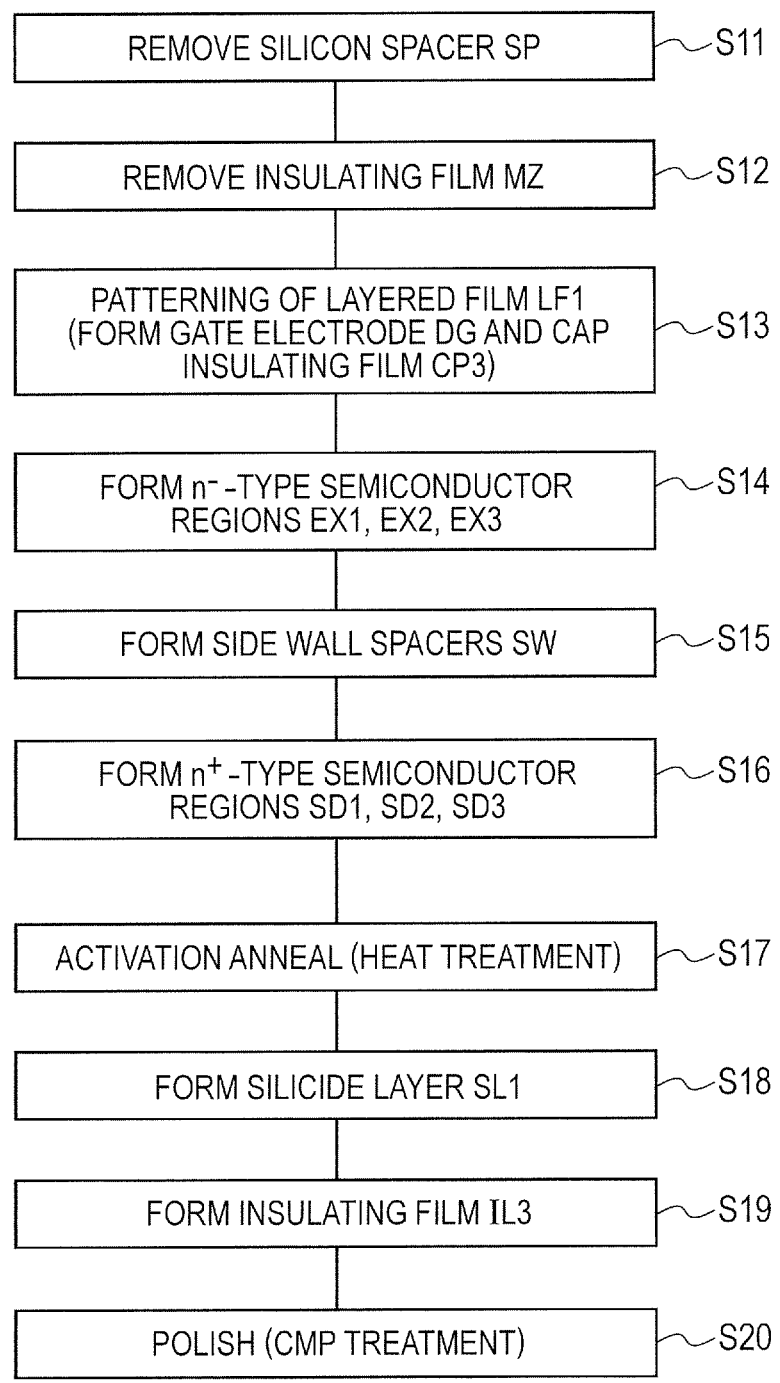
FIG. 2 is a process flowchart showing a part of the manufacturing step of the semiconductor device that is an embodiment.
Figure 3:
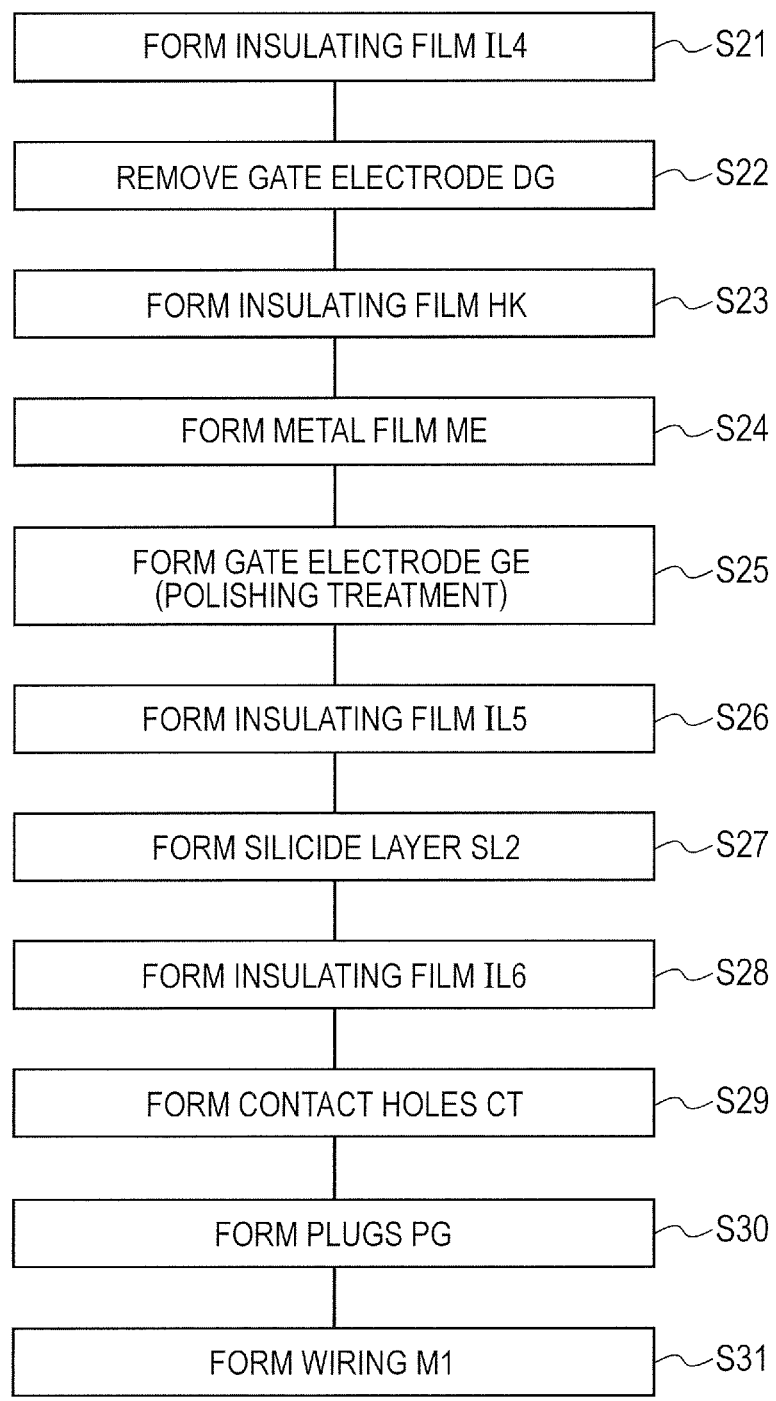
FIG. 3 is a process flowchart showing a part of the manufacturing step of the semiconductor device that is an embodiment.

FIG. 1 to FIG. 3 are the process flowcharts showing a part of the manufacturing step of the semiconductor device of the present embodiment. FIG. 4 to FIG. 21 are the cross-sectional views of an essential part during the manufacturing step of the semiconductor device of the present embodiment. Also, in the cross-sectional views of FIG. 4 to FIG. 21, the cross-sectional views of an essential part of a memory cell region 1A, a peripheral circuit region 1B, and a shunt region SH are shown, and the states of forming a memory cell of a non-volatile memory in the memory cell region 1A, a MISFET in the peripheral circuit region 1B, and a shunt structure in the shunt region SH respectively in a semiconductor substrate SB are shown.

The memory cell region 1A, the peripheral circuit region 1B, and the shunt region SH exist in the same semiconductor substrate SB. In the cross-sectional views of FIG. 4 to FIG. 21, the memory cell region 1A, the peripheral circuit region 1B, and the shunt region SH are illustrated in this order, however, the memory cell region 1A and the peripheral circuit region 1B as well as the peripheral circuit region 1B and the shunt region SH may not be adjacent to each other.

In the memory cell region 1A, plural split gate type memory cells are disposed in a matrix shape, and the memory cell is comprised of an n-channel type MISFET (a control transistor and a memory transistor). The memory cell includes a control gate electrode that is formed over a semiconductor substrate through a gate insulating film, a memory gate electrode that is formed over the semiconductor substrate through a gate insulating film including an electric charge storage region, and a pair of semiconductor regions (a source region and a drain region) formed over the surface of the semiconductor substrate so as to sandwich the control gate electrode and the memory gate electrode.

Also, in the present embodiment, a case of forming the re-channel type MISFET (the control transistor and the memory transistor) in the memory cell region 1A will be explained, however, it is also possible to reverse the electro-conductive type and to form a p-channel type MISFET (the control transistor and the memory transistor) in the memory cell region 1A. Although it will be described below, the control transistor includes a control gate electrode comprised of a silicon film (polycrystalline silicon film) for example, and the memory transistor includes a memory gate electrode comprised of a silicon film (polycrystalline silicon film) for example.

The shunt region (electric supply region) SH is a region for coupling the control gate electrode and the memory gate electrode that are formed integrally with (commonly to) the plural memory cells with the control gate line (selection gate line) and the memory gate line, and is disposed so as to be adjacent to the memory cell region 1A. The control gate electrode and the memory gate electrode that extend to the memory cell region 1A extend to the shunt region SH continuously. In the shunt region SH, the control gate electrode is coupled with the control gate line, and the memory gate electrode MG is coupled with the memory gate line.

The peripheral circuit 1B is a circuit other than a non-volatile memory, and is a processor such as a CPU, control circuit, sense amplifier, column decoder, row decoder, and the like for example. The MISFET formed in the peripheral circuit 1B is a MISFET for the peripheral circuit. In the present embodiment, a case of forming the n-channel type MISFET in the peripheral circuit region 1B will be explained, however, it is also possible to reverse the electro-conductive type and to form a p-channel type MISFET in the peripheral circuit region 1B, and it is also possible to form a CMISFET (Complementary MISFET) and the like in the peripheral circuit region 1B.

Figure 4:
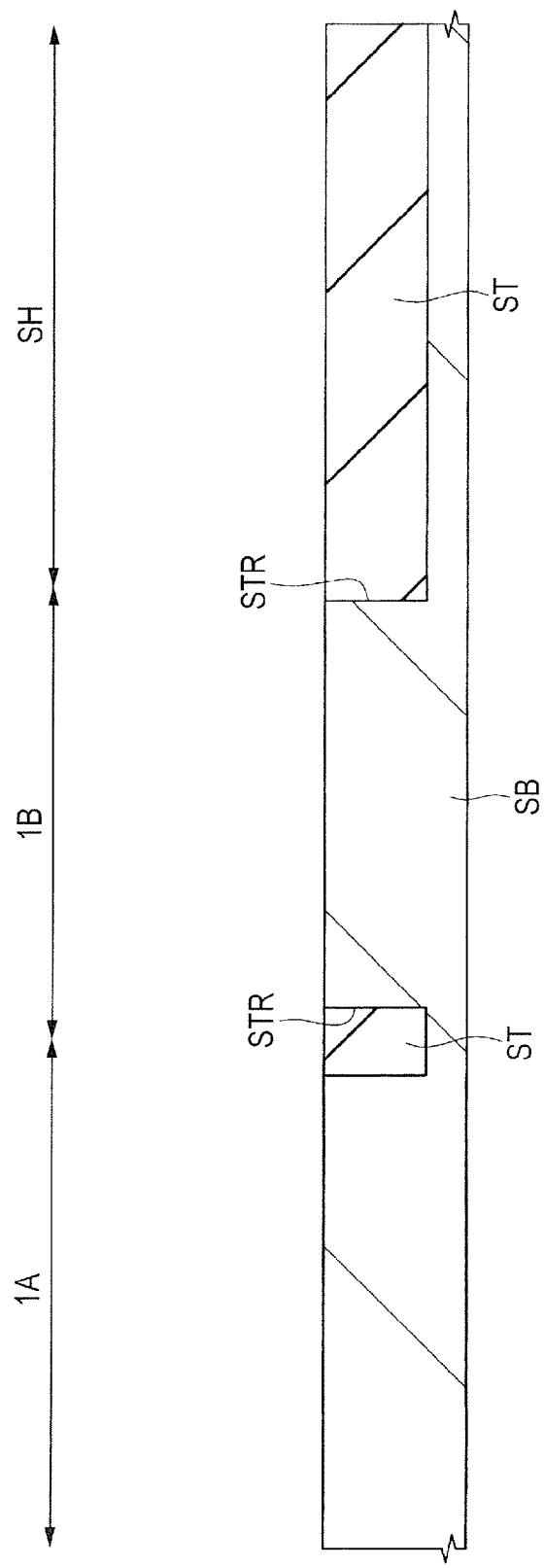
FIG. 4 is a cross-sectional view of an essential part during the manufacturing step of a semiconductor device of an embodiment.

As shown in FIG. 4, first, the semiconductor substrate (semiconductor wafer) SB comprised of a p-type polycrystalline silicon and the like having the specific resistance of approximately 1-10 Ωcm for example is provided (Step S1 of FIG. 1). Then, element separation regions (inter-element separating and insulating regions) ST that define an active region are formed over the main surface of the semiconductor substrate SB (Step S2 of FIG. 1).

The element separation region ST is comprised of an insulating body such as silicon oxide, and can be formed by the STI (Shallow Trench Isolation) method or the LOCOS (Local Oxidization of Silicon) method and the like for example. The element separation region ST can be formed for example by forming a trench STR for separating the element in the main surface of the semiconductor substrate SB and thereafter embedding an insulating film comprised of silicon oxide for example in the inside of this trench STR for separating the element. More specifically, after forming the trench STR for separating the element in the main surface of the semiconductor substrate SB, an insulating film (silicon oxide film for example) for forming the element separation region is formed over the semiconductor substrate SB so as to embed this trench STR for separating the element therein. Then, by removing the insulating film outside the trench STR for separating the element (the insulating film for forming the element separation region), the element separation region ST comprised of the insulating film embedded in the trench STR for separating the element can be formed. The element separation region ST is disposed in the main surface of the semiconductor substrate SB so as to surround the active region where the element is formed. In other words, the elements are separated from each other by the element separation region ST. The element separation region ST electrically separates the memory cell region 1A and the peripheral circuit region 1B from each other, electrically separates the memory cells from each other in the memory cell region 1A, and electrically separates the plural MISFETs from each other in the peripheral circuit region 1B. In the shunt region SH, the element separation region ST having a large width is formed.

Figure 5:
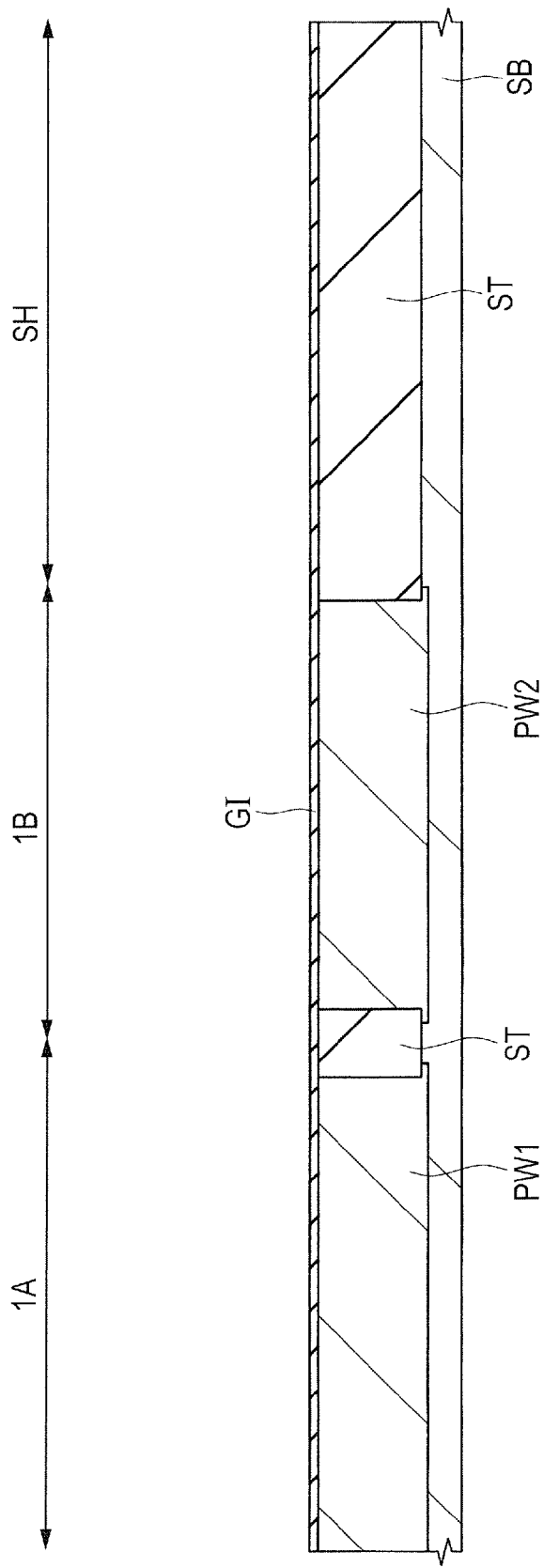
FIG. 5 is a cross-sectional view of an essential part during the manufacturing step of the semiconductor device following FIG. 4.

Next, as shown in FIG. 5, a p-type well PW1 is formed in the memory cell region 1A of the semiconductor substrate SB, and a p-type well PW2 is formed in the peripheral circuit region 1B (Step S3 of FIG. 1). The p-type wells PW1, PW2 can be formed by ion injection and the like of the p-type impurities such as boron (B) for example into the semiconductor substrate SB. The p-type wells PW1, PW2 are formed over a predetermined depth from the main surface of the semiconductor substrate SB. Because the p-type well PW1 and the p-type well PW2 have a same electro-conductive type, they may be formed in a same ion injection step or may be formed in a different ion injection step. Although it is not illustrated, the p-type well PW1 of the memory cell region 1A is covered with an n-type well in a plan view and a cross-sectional view, and is electrically separated from the p-type well PW2 of the peripheral circuit region 1B.

Next, after cleaning the surface of the semiconductor substrate SB (the p-type wells PW1, PW2) by diluted hydrofluoric acid cleaning and the like, an insulating film GI for a gate insulating film is formed over the main surface of the semiconductor substrate SB (the surface of the p-type wells PW1, PW2) (Step S4 of FIG. 1).

The insulating film GI is formed of a thin silicon oxide film or an oxynitride silicon film and the like for example, and the forming film thickness of the insulating film GI can be made approximately 2-3 nm for example. The insulating film GI can be formed by the thermal oxidation method, the CVD (Chemical Vapor Deposition) method, or the plasma nitriding method. When the insulating film GI is formed by the thermal oxidation method, the insulating film GI is not formed over the element separation region ST.

As another aspect, in Step S4, it is also possible to form the insulating film GI of the peripheral circuit region 1B with a different film thickness in a step other than the step for the insulating film GI of the memory cell region 1A.

Figure 6:
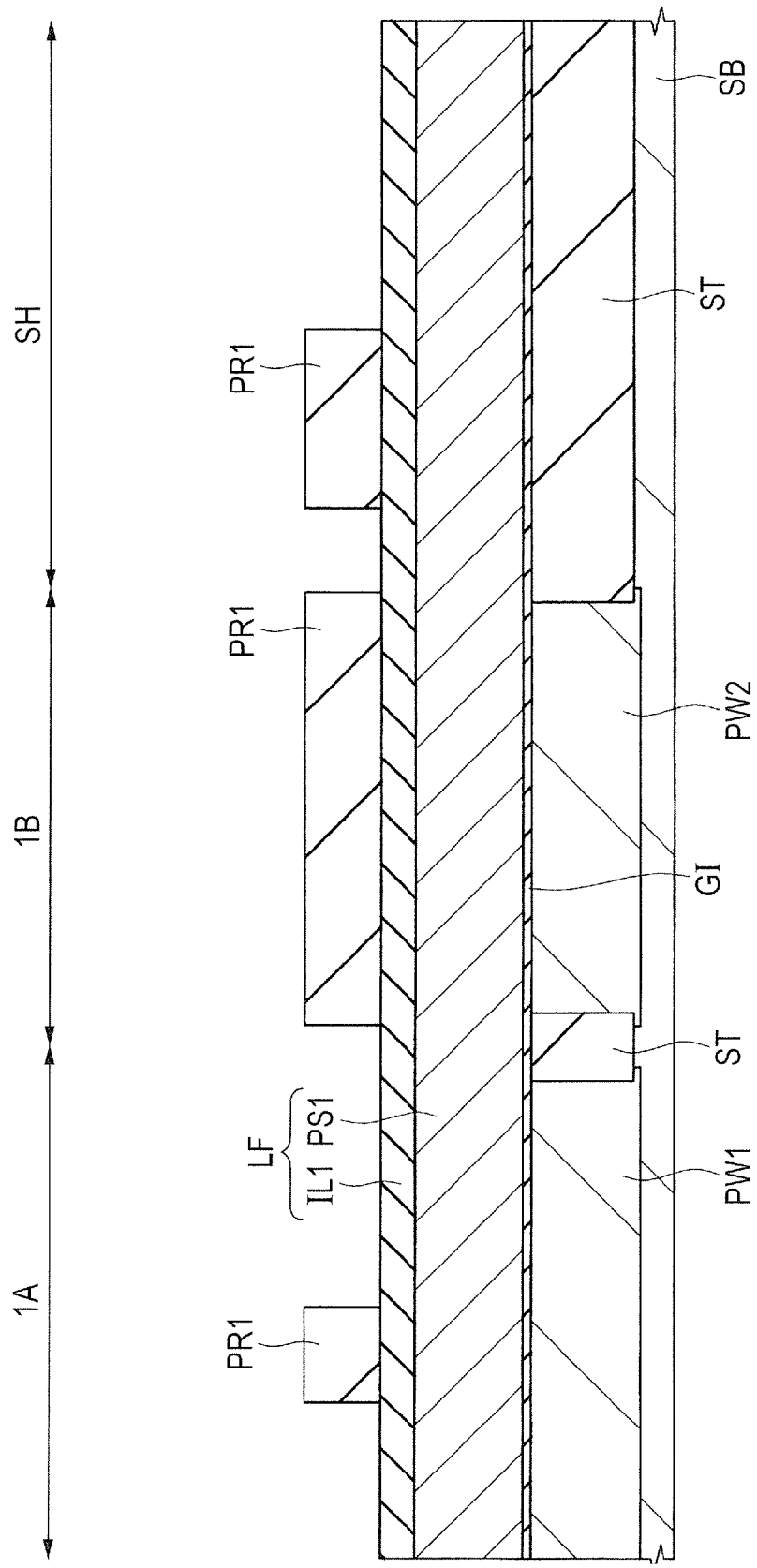
FIG. 6 is a cross-sectional view of an essential part during the manufacturing step of the semiconductor device following FIG. 5.

Next, as shown in FIG. 6, a silicon film PS1 is formed (laminated) over the main surface (entire surface of the main surface) of the semiconductor substrate SB namely over the insulating film GI of the memory cell region 1A and the peripheral circuit region 1B and over the element separation region ST of the shunt region SH (Step S5 of FIG. 1).

The silicon film PS1 is an electro-conductive film for forming a control gate electrode CG described below, and is an electro-conductive film for forming a first electrode D1 described below which is formed integrally with the control gate electrode CG in the shunt region SH. Further, the silicon film PS1 serves also as an electro-conductive film for forming a gate electrode DG described below. In other words, the control gate electrode CG described below, the gate electrode DG described below, and the first electrode D1 described below are formed by the silicon film PS1.

The silicon film PS1 is comprised of a polycrystalline silicon film (polysilicon film), and can be formed using the CVD method and the like. The laminated film thickness of the silicon film PS1 can be made approximately 50-100 nm for example. The silicon film PS1 can be made a semiconductor film of low resistance (doped polysilicon film) by introducing impurities at the time of film formation or by ion-injection of impurities after film formation. It is preferable that the silicon film PS1 of the memory cell region 1A and the shunt region SH is an n-type silicon film to which n-type impurities such as phosphor (P), arsenic (As) or the like has been introduced.

Next, an insulating film IL1 is formed (laminated) over the main surface (entire surface of the main surface) of the semiconductor substrate SB namely over the silicon film PS1 (Step S6 of FIG. 1).

The insulating film IL1 is an insulating film for forming cap insulating films CP1, CP2, CP3 described below. The insulating film IL1 is comprised of a silicon nitride film and the like for example, and can be formed using the CVD method and the like. The laminated film thickness of the insulating film IL1 can be made approximately 20-50 nm for example. By executing Steps S5, S6, a state of forming a laminated film LF of the silicon film PS1 and the insulating film IL1 over the silicon film PS1 comes up. Here, the laminated film LF is comprised of the silicon film PS1 and the insulating film IL1 over the silicon film PS1.

Next, the laminated film LF namely the insulating film IL1 and the silicon film PS1 is patterned by the photolithography technology and the etching technology, and a laminated body (laminated structure) LM1 including the control gate electrode CG and the cap insulating film CP1 over the control gate electrode CG is formed in the memory cell region 1A (Step S7 of FIG. 1).

Figure 7:
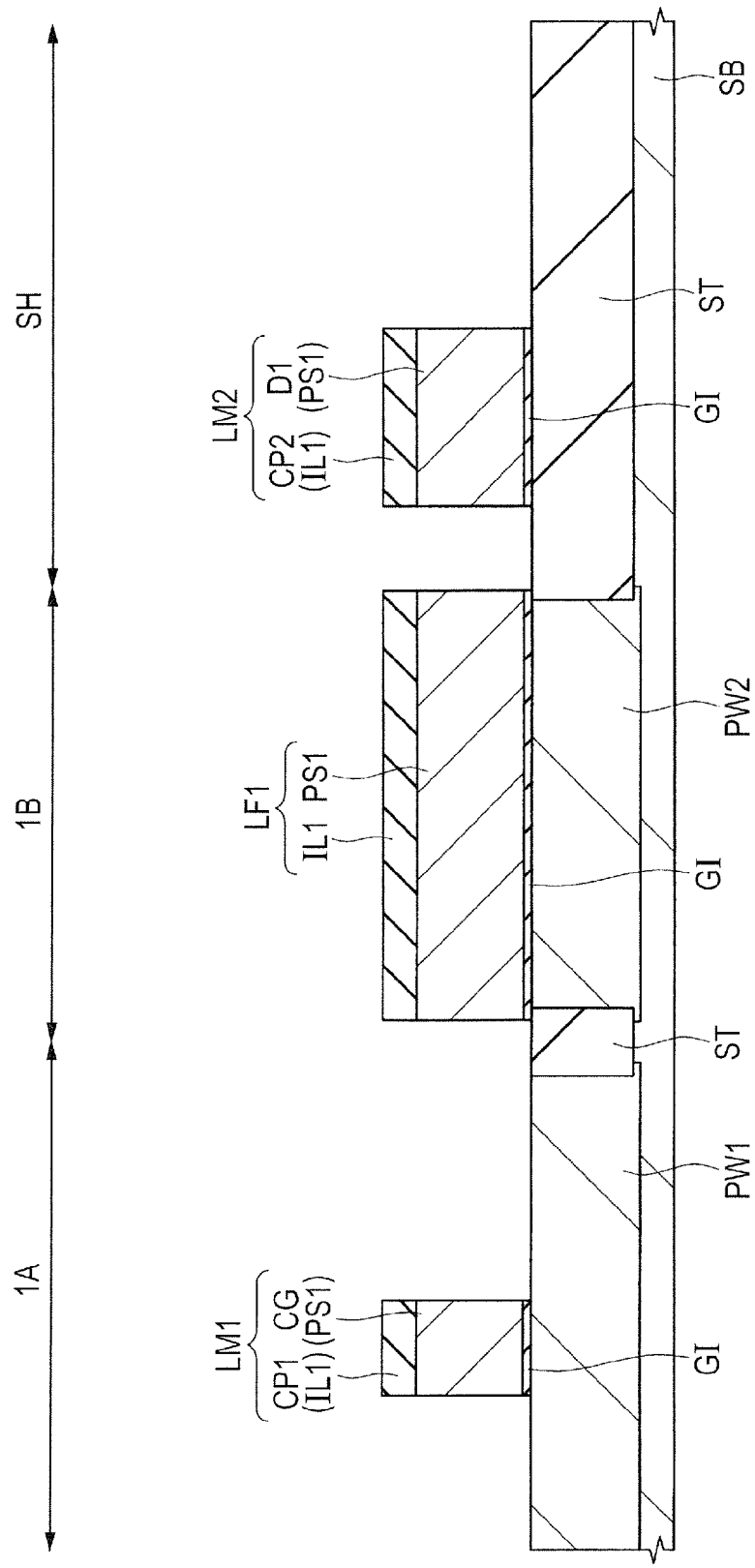
FIG. 7 is a cross-sectional view of an essential part during the manufacturing step of the semiconductor device following FIG. 6.

Step S7 can be executed as follows. That is to say, first, as shown in FIG. 6, a photoresist pattern PR1 is formed as a resist pattern over the insulating film IL1 using the photolithography method. This photoresist pattern PR1 is formed in a control gate electrode CG formation planned region in the memory cell region 1A, the entire peripheral circuit region 1B, and a first electrode D1 formation planned region in the shunt region SH. Then, the laminated film LF of the silicon film PS1 and the insulating film IL1 in the memory cell region 1A and the shunt region SH is patterned by etching (preferably by dry etching) using this photoresist pattern PR1 as an etching mask, and this photoresist pattern PR1 is thereafter removed. Thus, as shown in FIG. 7, the laminated film LM1 including the control gate electrode CG comprised of the silicon film PS1 having been patterned and the cap insulating film CP1 comprised of the insulating film IL1 having been patterned is formed in the memory cell region 1A. Also, a laminated body LM2 including the first electrode D1 comprised of the silicon film PS1 having been patterned and the cap insulating film CP2 comprised of the insulating film IL1 having been patterned is formed in the shunt region SH.

The laminated body LM1 is comprised of the control gate electrode CG and the cap insulating film CP1 over the control gate electrode CG, and is formed over the semiconductor substrate SB (the p-type well PW1) of the memory cell region 1A through the insulating film GI. The control gate electrode CG and the cap insulating film CP1 have plan shapes generally same to each other in a plan view, and overlap with each other in a plan view.

Figure 8:
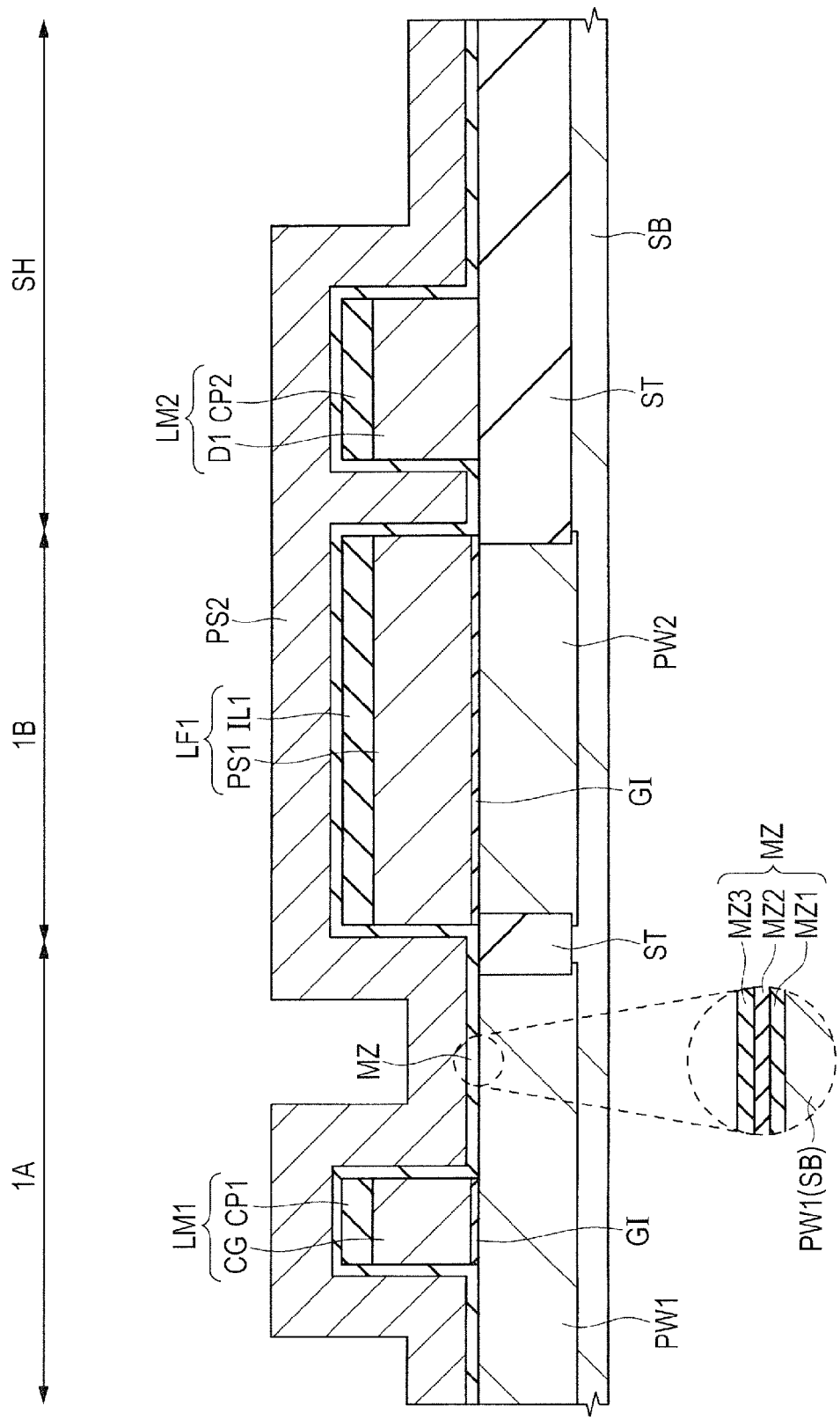
FIG. 8 is a cross-sectional view of an essential part during the manufacturing step of the semiconductor device following FIG. 7.

The laminated film LM2 is comprised of the first electrode D1 and the cap insulating film CP2 over the first electrode, and is formed over the element separation region ST of the shunt region SH through the insulating film GI. In FIG. 8 and onward, the insulating film GI over the element separation region ST will be omitted. The first electrode D1 and the cap insulating film CP2 have plan shapes generally same to each other in a plan view, and overlap with each other in a plan view.

When Step S7 is executed, the silicon film PS1 and the insulating film IL1 other than the portion that becomes the laminated body LM1 are removed in the memory cell region 1A, and the silicon film PS1 and the insulating film IL1 other than the portion that becomes the laminated body LM2 are removed in the shunt region SH. On the other hand, in the peripheral circuit region 1B, the photoresist pattern PR1 is formed in the entire peripheral circuit region 1B. Therefore, even when Step S7 is executed, in the peripheral circuit region 1B, the laminated film LF1 comprised of the silicon film PS1 and the insulating film IL1 over the silicon film PS1 remains as it is without being removed namely without being patterned. The laminated film LF remaining in the peripheral circuit region 1B is marked with the reference sign LF1 and is to be called the laminated film LF1.

In the memory cell region 1A, the control gate electrode CG comprised of the patterned silicon film PS1 is formed, and the control gate electrode CG is a gate electrode for the control transistor. The insulating film GI that remains below the control gate electrode CG becomes a gate insulating film of the control transistor. Therefore, in the memory cell region 1A, the control gate electrode CG comprised of the silicon film PS1 becomes a state of being formed over the semiconductor substrate SB (the p-type well PW1) through the insulating film GI as the gate insulating film.

In the memory cell region 1A, the insulating film GI other than the portion that is covered with the laminated body LM1 namely the insulating film GI other than the portion that becomes the gate insulating film can possibly be removed by executing dry etching executed in the patterning step of Step S7 or by executing wet etching after the dry etching.

Next, as shown in FIG. 8, an insulating film MZ for a gate insulating film of a memory transistor is formed over the entire surface of the semiconductor substrate SB namely over the main surface (surface) of the semiconductor substrate SB and over the surface (the upper surfaces and the side surfaces) of the laminated bodies LM1, LM2 (Step S8 of FIG. 1).

In the peripheral circuit region 1B, because the laminated film LF1 remains, the insulating film MZ can possibly be formed over the surface (the upper surface and the side surface) of this laminated film LF1 also. Therefore, in Step S8, the insulating film MZ is formed over the semiconductor substrate SB so as to cover the laminated body LM1 of the memory cell region 1A, the laminated body LM2 of the shunt region SH, and the laminated film LF1 of the peripheral circuit region 1B.

The insulating film MZ is an insulating film for the gate insulating film of the memory transistor, and is an insulating film that includes an electric charge storage section in the inside thereof. This insulating film MZ is comprised of a laminated film of a silicon oxide film (oxide film) MZ1, a silicon nitride film (nitride film) MZ2 formed over the silicon oxide film MZ1, and a silicon oxide film (oxide film) MZ3 formed over the silicon nitride film MZ2. The laminated film of the silicon oxide film MZ1, the silicon nitride film MZ2, and the silicon oxide film MZ3 can also be deemed to be an ONO (oxide-nitride-oxide) film.

Also, in order to make the drawing easy-to-use, in FIG. 8, the insulating film MZ comprised of the silicon oxide film MZ1, the silicon nitride film MZ2, and the silicon oxide film MZ3 is illustrated simply as the insulating film MZ. In the present embodiment, as an insulating film (electric charge storage layer) having the trap level, the silicon nitride film MZ2 is exemplified, however, the insulating film is not limited to the silicon nitride film, and a high dielectric constant film having a higher dielectric constant compared to the silicon nitride film such as an aluminum oxide (alumina) film, a hafnium oxide film, or a tantalum oxide film for example can be also used as an electric charge storage layer or an electric charge storage section. Further, the electric charge storage layer or the electric charge storage section can be also formed of silicon nano-dots.

In order to form the insulating film MZ, for example, first, after forming the silicon oxide film MZ1 by the thermal oxidation method (preferably ISSG oxidation), the silicon nitride film MZ2 is laminated over the silicon oxide film MZ1 by the CVD method, and the silicon oxide film MZ3 is further formed over the silicon nitride film MZ2 by the CVD method, or by the thermal oxidation method, or by both of them. Thus, the insulating film MZ comprised of the laminated film of the silicon oxide film MZ1, the silicon nitride film MZ2, and the silicon oxide film MZ3 can be formed.

The thickness of the silicon oxide film MZ1 can be made approximately 2-10 nm for example, the thickness of the silicon nitride film MZ2 can be made approximately 5-15 nm for example, and the thickness of the silicon oxide film MZ3 can be made approximately 2-10 nm for example. With respect to the last oxide film namely the silicon oxide film MZ3 of the uppermost layer out of the insulating film MZ, a high withstanding voltage film can be formed also by oxidizing the upper layer portion of the nitride film (the silicon nitride film MZ2 of the middle layer out of the insulating film MZ) for example. The insulating film MZ functions as a gate insulating film of a memory gate electrode MG formed later.

Next, a silicon film PS2 is formed (laminated) as an electro-conductive film for forming the memory gate electrode MG over the main surface (entire surface of the main surface) of the semiconductor substrate SB namely over the insulating film MZ so as to cover the laminated bodies LM1, LM2 in the memory cell region 1A and the shunt region SH, and so as to cover the laminated film LF1 in the peripheral circuit region 1B (Step S9 of FIG. 1).

The silicon film PS2 is an electro-conductive film for a gate electrode of a memory transistor, and is an electro-conductive film for forming a second electrode D2 described below which is formed integrally with the memory gate electrode MG in the shunt region SH. The silicon film PS2 is comprised of a polycrystalline silicon film, and can be formed using the CVD method and the like. The laminated film thickness of the silicon film PS2 can be made approximately 30-150 nm for example.

Also, the silicon film PS2 is made a semiconductor film (doped polysilicon film) of low resistance by introducing impurities at the time of film formation or by introducing impurities by ion-injection of impurities after film formation. The silicon film PS2 is an n-type silicon film to which n-type impurities such as phosphor (P), arsenic (As) or the like preferably has been introduced.

Next, the silicon film PS2 is subjected to etching back (etching, anisotropic dry etching, anisotropic etching) by the anisotropic etching technology (Step S10 of FIG. 1).

Figure 9:
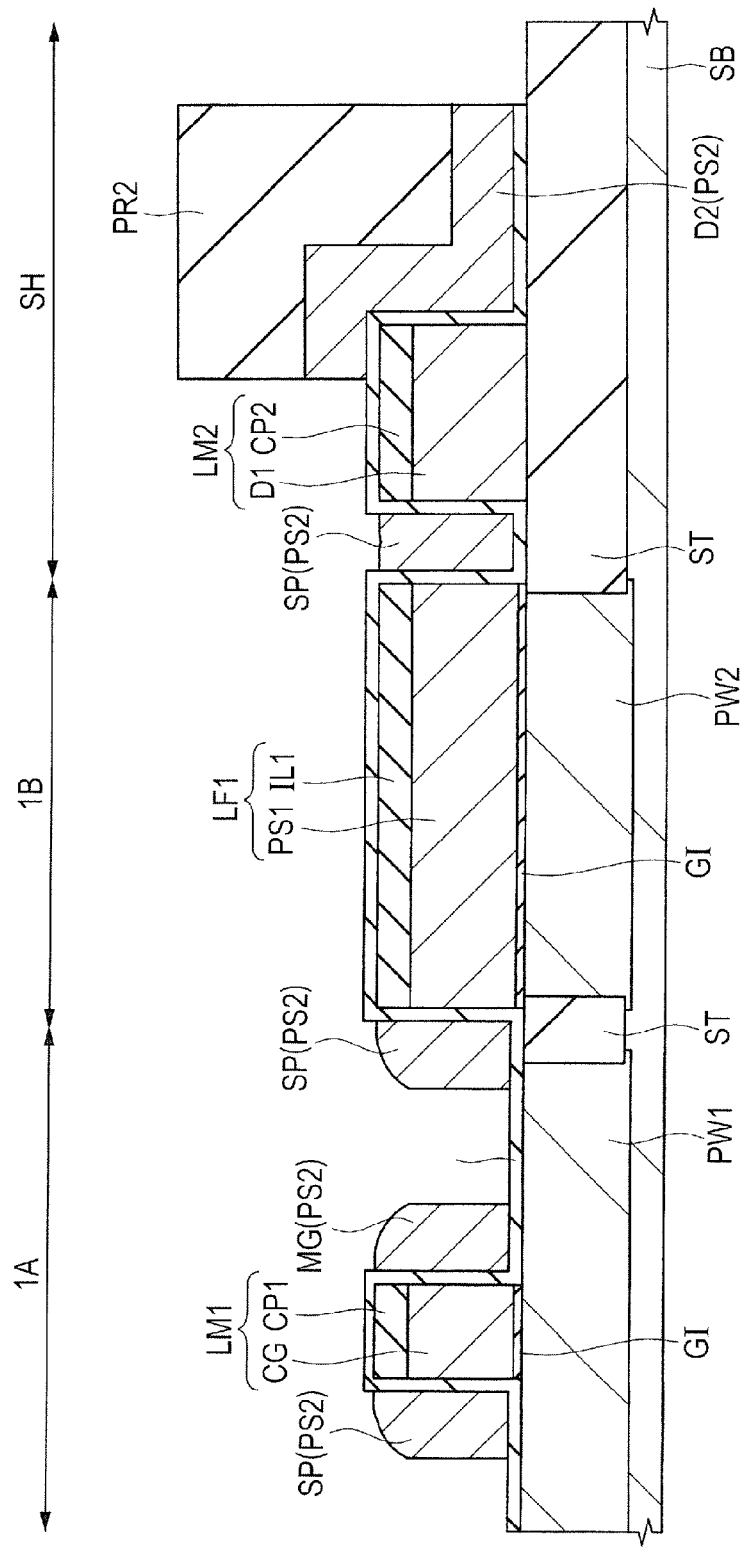
FIG. 9 is a cross-sectional view of an essential part during the manufacturing step of the semiconductor device following FIG. 8.

Because the silicon film PS2 is subjected to etching back by the etch back step of Step S10, the silicon film PS2 is made to remain in a side wall spacer shape over both of the side walls of the laminated body LM1 through the insulating film MZ, and the silicon film PS2 of the other region of the memory cell region 1A is removed. Thus, as shown in FIG. 9, in the memory cell region 1A, the memory gate electrode MG is formed over one side wall out of both of the side walls of the laminated body LM1 through the insulating film MZ by the silicon film PS2 having remained in a side wall spacer shape, and a silicon spacer SP is formed over the other side wall by the silicon film PS2 having remained in a side wall spacer shape through the insulating film MZ. The memory gate electrode MG is formed over the insulating film MZ so as to be adjacent to the laminated body LM1 through the insulating film MZ. Because the laminated body LM1 is comprised of the control gate electrode CG and the cap insulating film CP1 over the control gate electrode CG, the memory gate electrode MG is formed over the insulating film MZ so as to be adjacent to the control gate electrode CG and the cap insulating film CP1 through the insulating film MZ.

Also, in the shunt region SH, before the etch back step of Step S10, a photoresist pattern PR2 is formed as a resist pattern (mask film) over the silicon film PS2 using the photolithography method. This photoresist pattern PR2 is formed in a second electrode D2 formation planned region in the shunt region SH. Therefore, in the shunt region SH after the etch back step of Step S10, the second electrode D2 is formed which covers a part of the upper surface and the side surface of the laminated body LM2 through the insulating film MZ and extends over the element separation region ST. As shown in FIG. 9, the second electrode D2 has a reverse S-shape, and is comprised of a first section formed along the side wall of the first electrode D1, a second section formed over the element separation region ST and extending continuously from one end (lower end) of the first section in the direction of departing from the first electrode D1, and a third section extending over the first electrode D1 from the other end (upper end) of the first section. Also, in the side wall of the laminated body LM2 not covered by the second electrode D2, the silicon spacer SP is formed through the insulating film MZ.

Further, also over the side wall of the laminated film LF1 that is made to remain in the peripheral circuit region 1B, the silicon spacer SP is formed through the insulating film MZ.

The silicon spacer SP can be deemed also a side wall spacer comprised of an electric conductor namely an electric conductor spacer. In the memory cell region 1A, the memory gate electrode MG and the silicon spacer SP are formed over the side walls of the laminated body LM1 which become the opposite side from each other, and has a structure generally symmetric across the laminated body LM1.

At the stage the etch back step of Step S10 has been completed, it is preferable that the height of the memory gate electrode MG and the silicon spacer SP is higher than the height of the control gate electrode CG. By making the height of the memory gate electrode MG higher than the height of the control gate electrode CG, in the polishing step of Step S20 described below, the upper part of the memory gate electrode MG can be exposed accurately, and the exposure failure of the memory gate electrode MG can be prevented.

Figure 10:
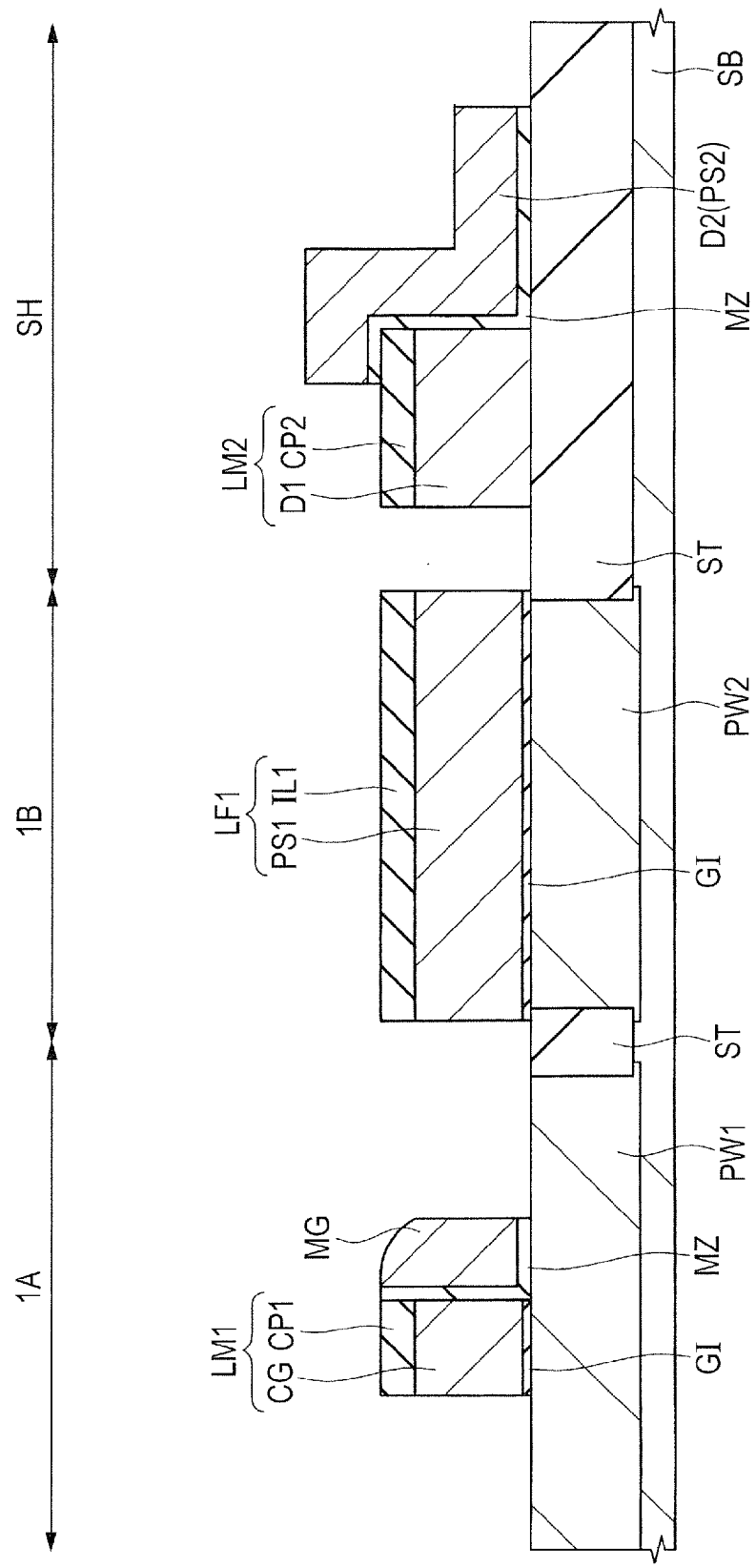
FIG. 10 is a cross-sectional view of an essential part during the manufacturing step of the semiconductor device following FIG. 9.

Next, after forming a photoresist pattern (not illustrated) of covering the memory gate electrode MG and exposing the silicon spacer SP over the semiconductor substrate SB using the photolithography technology, by dry etching using this photoresist pattern as the etching mask, the silicon spacer SP is removed (Step S11 of FIG. 2). It is important that this photoresist pattern is a pattern that covers the second electrode D2 in the shunt region SH. Thereafter, the photoresist pattern is removed. In the etching step of Step S11, as shown in FIG. 10, although the silicon spacer SP is removed, the memory gate electrode MG remains without being etched because it has been covered by the photoresist pattern. Also, the silicon spacers SP of the side walls of the laminated bodies LM2, LF1 are removed.

Next, as shown in FIG. 10, out of the insulating film MZ, the portions that are not covered by the memory gate electrode MG or the second electrode D2 and are exposed are removed by etching (wet etching for example) (Step S12 of FIG. 2). At this time, in the memory cell region 1A, the insulating film MZ positioned below the memory gate electrode MG and between the memory gate electrode MG and the laminated body LM1 remains without being removed, and the insulating film MZ of the other region is removed. Also, in the shunt region SH, the insulating film MZ covered by the second electrode D2 remains without being removed, and the insulating film MZ of the other region is removed. As it is known from FIG. 10, in the memory cell region 1A, the insulating film MZ extends continuously over both regions of the region between the memory gate electrode MG and the semiconductor substrate SB (the p-type well PW1) and the region between the memory gate electrode MG and the laminated body LM1.

The insulating film MZ of the region between the memory gate electrode MG and the semiconductor substrate SB (the p-type well PW1) functions as the gate insulating film of the memory transistor.

Figure 11:
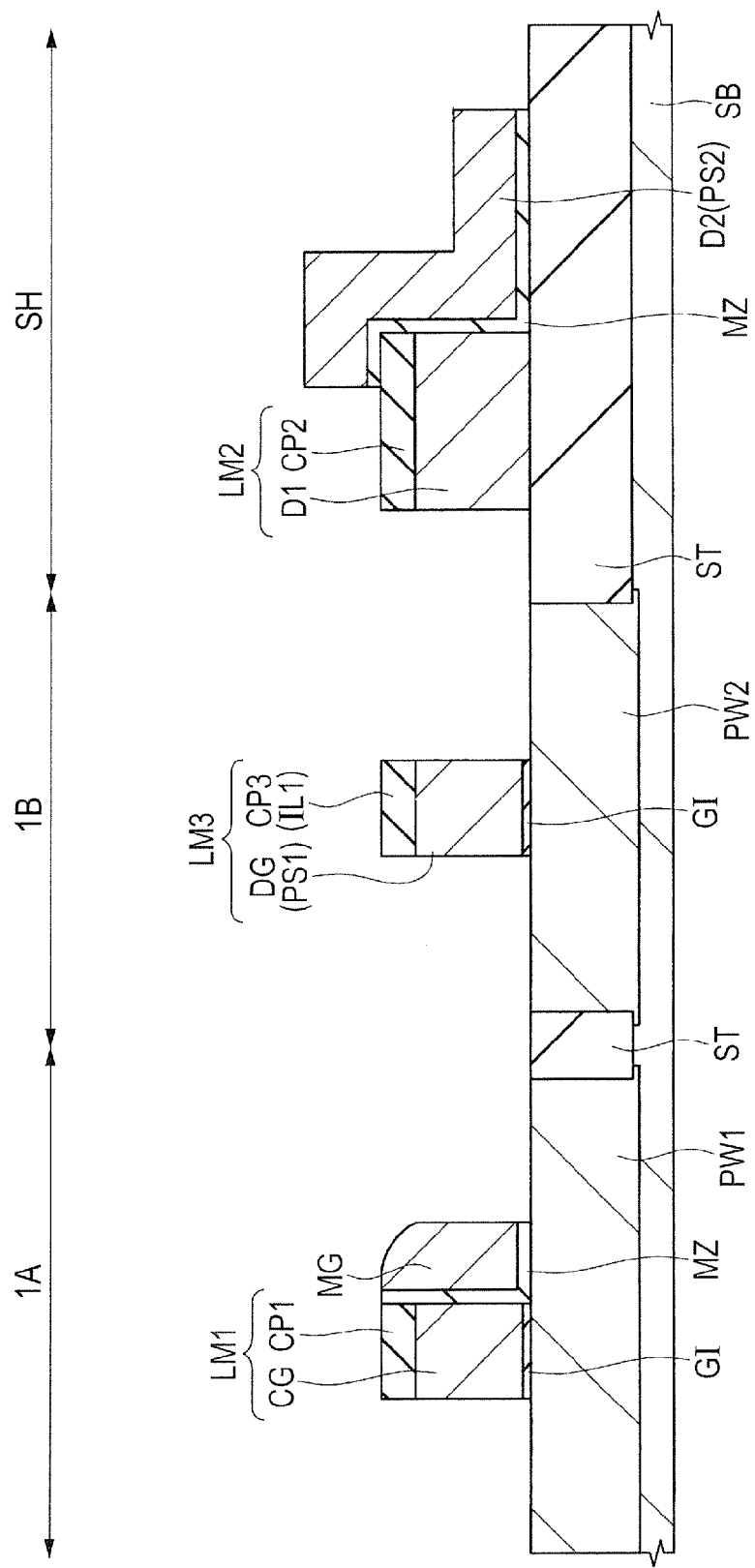
FIG. 11 is a cross-sectional view of an essential part during the manufacturing step of the semiconductor device following FIG. 10.

Next, by patterning the laminated film LF1 of the peripheral circuit region 1B using the photolithography technology and the etching technology, as shown in FIG. 11, a laminated body (laminated structure) LM3 including the gate electrode DG and the cap insulating film CP3 over the gate electrode DG is formed in the peripheral circuit region 1B (Step S13 of FIG. 2).

The patterning step of Step S13 can be executed as follows for example. That is to say, first, a photoresist pattern (not illustrated) is formed over the main surface of the semiconductor substrate SB using the photolithography method. This photoresist pattern is formed in the entire memory cell region 1A, the entire shunt region SH, and a gate electrode DG formation planned region in the peripheral circuit region 1B. Therefore, the memory gate electrode MG and the laminated body LM1 as well as the first electrode D1 and the second electrode D2 come to be covered by this photoresist pattern. Then, using this photoresist pattern as the etching mask, the laminated film LF1 of the silicon film PS1 and the insulating film IL1 in the peripheral circuit region 1B is patterned by etching (preferably by dry etching), and this photoresist pattern is thereafter removed. Thus, as shown in FIG. 11, the laminated body LM3 of the gate electrode DG comprised of the patterned silicon film PS1 and the cap insulating film CP3 comprised of the patterned insulating film IL1 is formed in the peripheral circuit region 1B.

The laminated body LM3 is comprised of the gate electrode DG and the cap insulating film CP3 over the gate electrode DG, and is formed over the semiconductor substrate SB (the p-type well PW2) of the peripheral circuit region 1B through the insulating film GI. The gate electrode DG and the cap insulating film CP3 have the plan shapes generally same to each other in a plan view, and overlap with each other in a plan view. Also, the gate electrode DG is a gate electrode of a dummy (imitating gate electrode), and is removed afterwards. Therefore the gate electrode DG can be called a dummy gate electrode. Further, because the gate electrode DG is removed afterwards and is replaced with a gate electrode GE described below, it can be deemed also to be a replacement gate electrode or a gate electrode for replacement.

The insulating film GI other than the portion covered by the laminated body LM3 in the peripheral circuit region 1B can be possibly removed by being subjected to dry etching executed in the patterning step of Step S13 or by being subjected to wet etching after the dry etching.

Thus, in the peripheral circuit region 1B, the laminated body LM3 including the gate electrode DG and the cap insulating film CP3 over the gate electrode DG is formed over the semiconductor substrate SB (the p-type well PW2) through the insulating film GI.

Thus, as shown in FIG. 11, in the memory cell region 1A, the control gate electrode CG is formed over the semiconductor substrate SB through the insulating film GI, and the memory gate electrode MG is formed over the semiconductor substrate SB through the insulating film MZ. Also, the gate electrode DG is formed over the semiconductor substrate SB through the insulating film GI in the peripheral circuit region 1B, and the first electrode D1 and the second electrode D2 are formed over the element separation region ST in the shunt region SH. Further, the control gate electrode CG is formed with the cap insulating film CP1 thereover, the first electrode D1 is formed with the cap insulating film CP2 thereover, and the gate electrode DG is formed with the cap insulating film CP3 thereover. The second electrode D2 formed in the shunt region SH is comprised of a third section that covers a part of the upper surface of the first electrode D1 through the insulating film MZ, a first section that covers the side wall of the first electrode D1 through the insulating film MZ, and a second section that is formed over the element separation region ST through the insulating film MZ.

Figure 12:
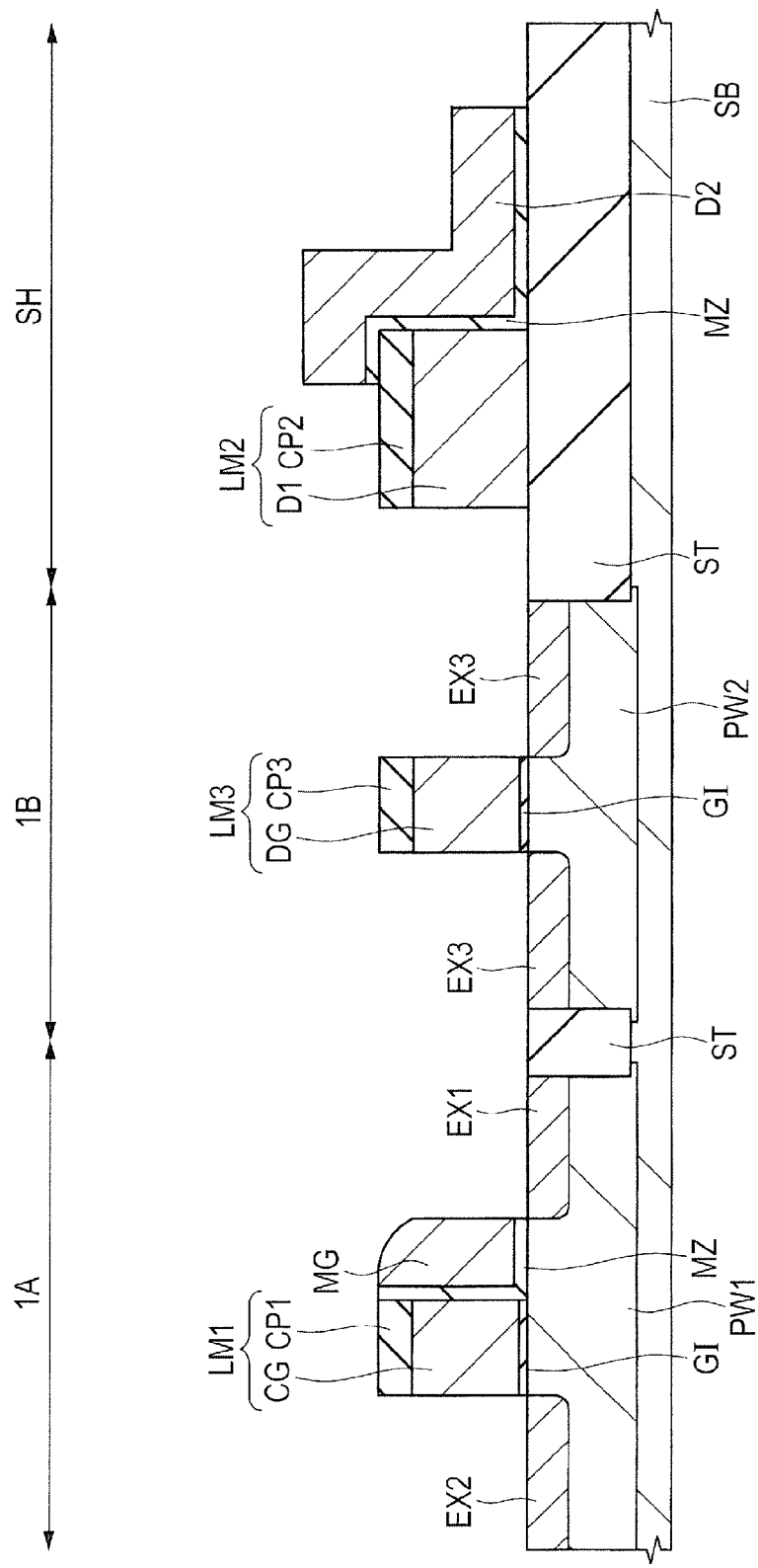
FIG. 12 is a cross-sectional view of an essential part during the manufacturing step of the semiconductor device following FIG. 11.

Next, as shown in FIG. 12, n⁻-type semiconductor regions (impurities diffusion layers) EX1, EX2, EX3 are formed using the ion injection method and the like (Step S14 of FIG. 2).

In Step S14, the n⁻-type semiconductor regions EX1, EX2, EX3 can be formed by introducing the n-type impurities such as arsenic (As) or phosphor (P) for example into the semiconductor substrate SB (the p-type wells PW1, PW2) by the ion injection method using the laminated body LM1, the memory gate electrode MG, and the laminated body LM3 as the masks (ion injection preventing masks). At this time, in the memory cell region 1A, the n⁻-type semiconductor region EX1 is formed so as to be self-aligned to the side wall of the memory gate electrode MG (the side wall of the opposite side of the side adjacent to the control gate electrode CG through the insulating film MZ) because the memory gate electrode MG functions as the mask (ion injection preventing mask). Also, the n⁻-type semiconductor region EX2 is formed so as to be self-aligned to the side wall of the control gate electrode CG (the side wall of the opposite side of the side adjacent to the memory gate electrode MG through the insulating film MZ) because the laminated body LM1 functions as the mask (ion injection preventing mask) in the memory cell region 1A. Further, the n⁻-type semiconductor regions EX3 are formed so as to be self-aligned to both side walls of the gate electrode DG because the laminated body LM3 functions as the mask (ion injection preventing mask) in the peripheral circuit region 1B. The n⁻-type semiconductor region EX1 and the n⁻-type semiconductor region EX2 can function as a part of the source/drain region (source or drain region) of a memory cell formed in the memory cell region 1A, and the n⁻-type semiconductor region EX3 can function as a part of the source/drain region (source or drain region) of a MISFET formed in the peripheral circuit region 1B. Although the n⁻-type semiconductor region EX1, the n⁻-type semiconductor region EX2, and the n⁻-type semiconductor region EX3 can be formed in a same ion injection step, they can be formed also in different ion injection steps.

Next, side wall spacers (side walls, side wall insulating films) SW comprised of insulating films are formed over the side walls of the laminated body LM1 and the memory gate electrode MG, over the side wall of the laminated body LM2 and over the side wall of the second electrode D2, and over the side walls of the laminated body LM3 as the side wall insulating films (Step S15 of FIG. 2). The side wall spacers SW can be deemed the side wall insulating films.

Figure 13:
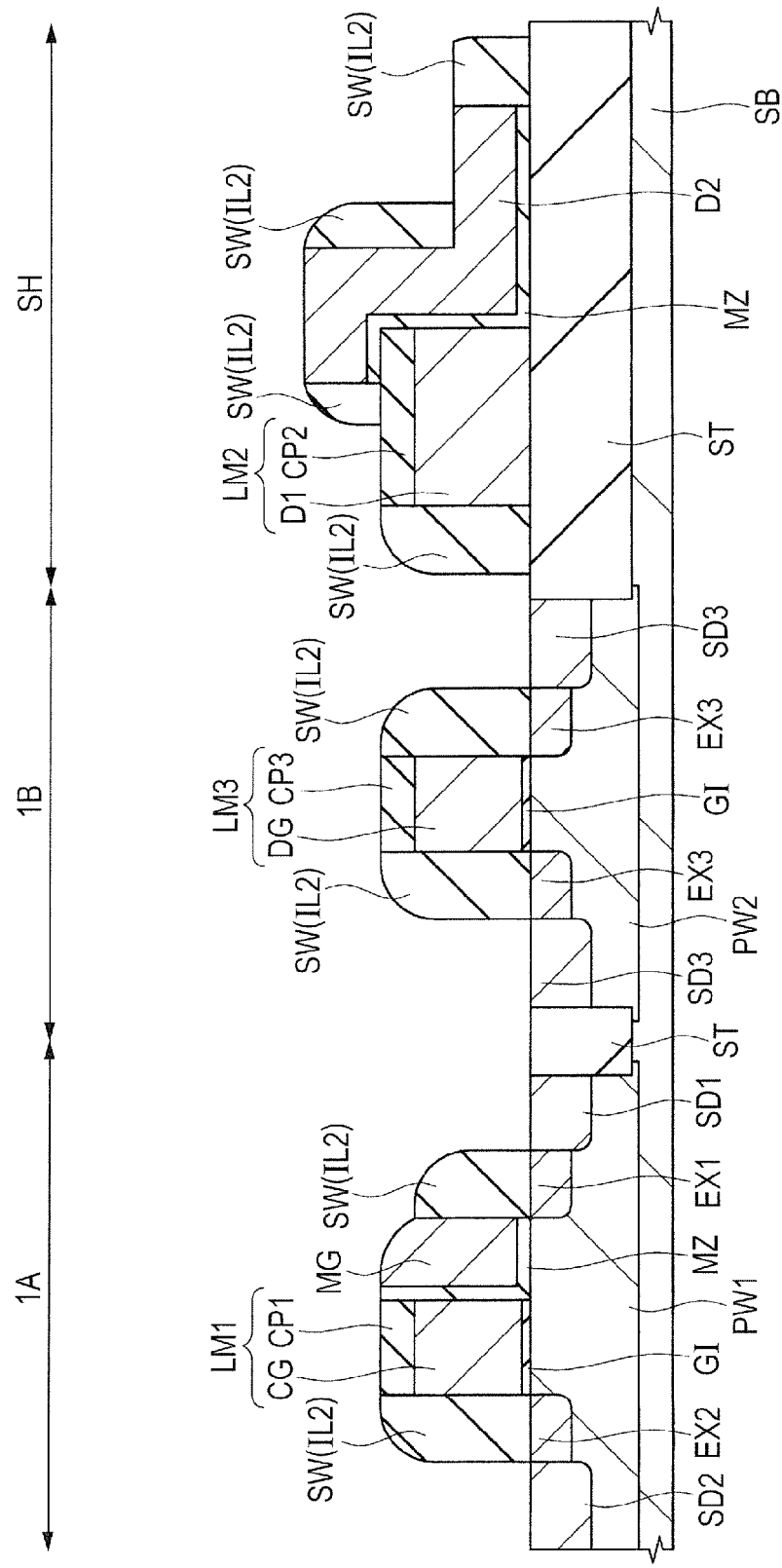
FIG. 13 is a cross-sectional view of an essential part during the manufacturing step of the semiconductor device following FIG. 12.

The side wall spacer SW forming step of Step S15 can be executed as follows for example. That is to say, an insulating film IL2 is formed (laminated) over the entire surface of the main surface of the semiconductor substrate SB. The insulating film IL2 is comprised of a silicon oxide film, or a silicon nitride film, or a laminated film of them, or the like for example, and can be formed using the CVD method and the like. The insulating film IL2 is formed over the semiconductor substrate SB so as to cover the memory gate electrode MG, the second electrode D2, and the laminated bodies LM1, LM2, LM3. Then, as shown in FIG. 13, this insulating film IL2 is subjected to etching back (etching, dry etching, anisotropic dry etching) by the anisotropic etching technology. Thus, this insulating film IL2 remains selectively over the side walls of the laminated body LM1 and the memory gate electrode MG, over the side walls of the laminated body LM2 and the second electrode D2, and over the side walls of the laminated body LM3, and the side wall spacers SW are formed. In the memory cell region 1A, the side wall spacers SW are formed over the side wall of the opposite side of the side adjacent to the memory gate electrode MG through the insulating film MZ out of the side walls of the laminated body LM1, and over the side wall of the opposite side of the side adjacent to the laminated body LM1 through the insulating film MZ out of the side walls of the memory gate electrode MG. Also, the side wall spacers SW are formed over both side walls of the laminated body LM3 in the peripheral circuit region 1B, and are formed over the side wall of the side where the second electrode D2 is not formed out of the side walls of the laminated body LM2, and over the side walls of the second electrode D2 in the shunt region SH. In other words, the side wall spacers SW are formed over the side walls of the first section, the second section, and the third section of the second electrode D2 respectively.

Next, as shown in FIG. 13, n⁺-type semiconductor regions (impurities diffusion layers) SD1, SD2, SD3 are formed using the ion injection method and the like (Step S16 of FIG. 2).

In Step S16, the n⁺-type semiconductor regions SD1, SD2, SD3 can be formed by introducing the n-type impurities such as arsenic (As) or phosphor (P) for example into the semiconductor substrate SB (the p-type wells PW1, PW2) by the ion injection method using the laminated body LM1, the memory gate electrode MG, the laminated body LM3, and the side wall spacers SW as the masks (ion injection preventing masks). At this time, in the memory cell region 1A, the n⁺-type semiconductor region SD1 is formed so as to be self-aligned to the side wall spacer SW over the side wall of the memory gate electrode MG because the memory gate electrode MG, and the side wall spacer SW over the side wall of the memory gate electrode MG function as the masks (ion injection preventing masks). Also, the n⁺-type semiconductor region SD2 is formed so as to be self-aligned to the side wall spacer SW over the side wall of the laminated body LM1 because the laminated body LM1 and the side wall spacer SW over the side wall thereof function as the masks (ion injection preventing masks) in the memory cell region 1A. Further, the n⁺-type semiconductor regions SD3 are formed so as to be self-aligned to the side wall spacers SW over both side walls of the laminated body LM3 because the laminated body LM3 and the side wall spacers SW over the side walls thereof function as the masks (ion injection preventing masks) in the peripheral circuit region 1B. Thus, an LDD (lightly doped drain) structure is formed. Although the n⁺-type semiconductor region SD1, the n⁺-type semiconductor region SD2, and the n⁺-type semiconductor regions SD3 can be formed in a same ion injection step, they can be formed also in different ion injection steps. Further, it is also possible to form the n⁺-type semiconductor region SD1 and the n⁺-type semiconductor region SD2 in same ion injection, and to form the n⁺-type semiconductor regions SD3 in another ion injection.

Thus, the n-type semiconductor region that functions as the source region of the memory transistor is formed by the n⁻-type semiconductor region EX1 and the n⁺-type semiconductor region SD1 that has a higher impurities concentration compared to the n⁻-type semiconductor region EX1, and the n-type semiconductor region that functions as the drain region of the control transistor is formed by the n⁻-type semiconductor region EX2 and the n⁺-type semiconductor region SD2 that has a higher impurities concentration compared to the n⁻-type semiconductor region EX2. Also, the n-type semiconductor region that functions as the source/drain region of the MISFET of the peripheral circuit region 1B is formed by the n⁻-type semiconductor region EX3 and the n⁺-type semiconductor regions SD3 that have a higher impurities concentration compared to the n⁻-type semiconductor region EX3. The n⁺-type semiconductor region SD1 has a higher impurities concentration and a deeper joint depth compared to the n⁻-type semiconductor region EX1, the n⁺-type semiconductor region SD2 has a higher impurities concentration and a deeper joint depth compared to the n⁻-type semiconductor region EX2, and the n⁺-type semiconductor regions SD3 have a higher impurities concentration and a deeper joint depth compared to the n⁻-type semiconductor region EX3.

NEXT, activation anneal is executed which is a heat treatment for activating the impurities having been introduced to the semiconductor regions for the source and drain (the n⁻-type semiconductor regions EX1, EX2, EX3, and the n⁺-type semiconductor regions SD1, SD2, SD3) and the like (Step S17 of FIG. 2).

Thus, a memory cell of a non-volatile memory is formed in the memory cell region 1A. On the other hand, because the gate electrode DG is a gate electrode of a dummy, in the MISFET of the peripheral circuit region 1B, although the source/drain region has been formed, a gate electrode (the gate electrode GE described below) that is used eventually has not been formed yet.

Next, a silicide layer SL1 is formed (Step S18 of FIG. 2). The silicide layer SL1 can be formed as follows.

First, a metal film is formed (laminated) over the entire surface of the main surface of the semiconductor substrate SB including over the upper surface (surface) of the n⁺-type semiconductor regions SD1, SD2, SD3 so as to cover the laminated body LM1, the memory gate electrode MG, the laminated body LM2 and the second electrode D2, the laminated body LM3, and the side wall spacers SW. The metal film can be comprised of a metal film of a single body (pure metal film) or an alloy film, preferably a cobalt (Co) film, a nickel (Ni) film, or a nickel-platinum alloy film, however, the nickel-platinum alloy film (platinum-added nickel film) is especially preferable. The metal film can be formed using the sputtering method and the like.

Figure 14:
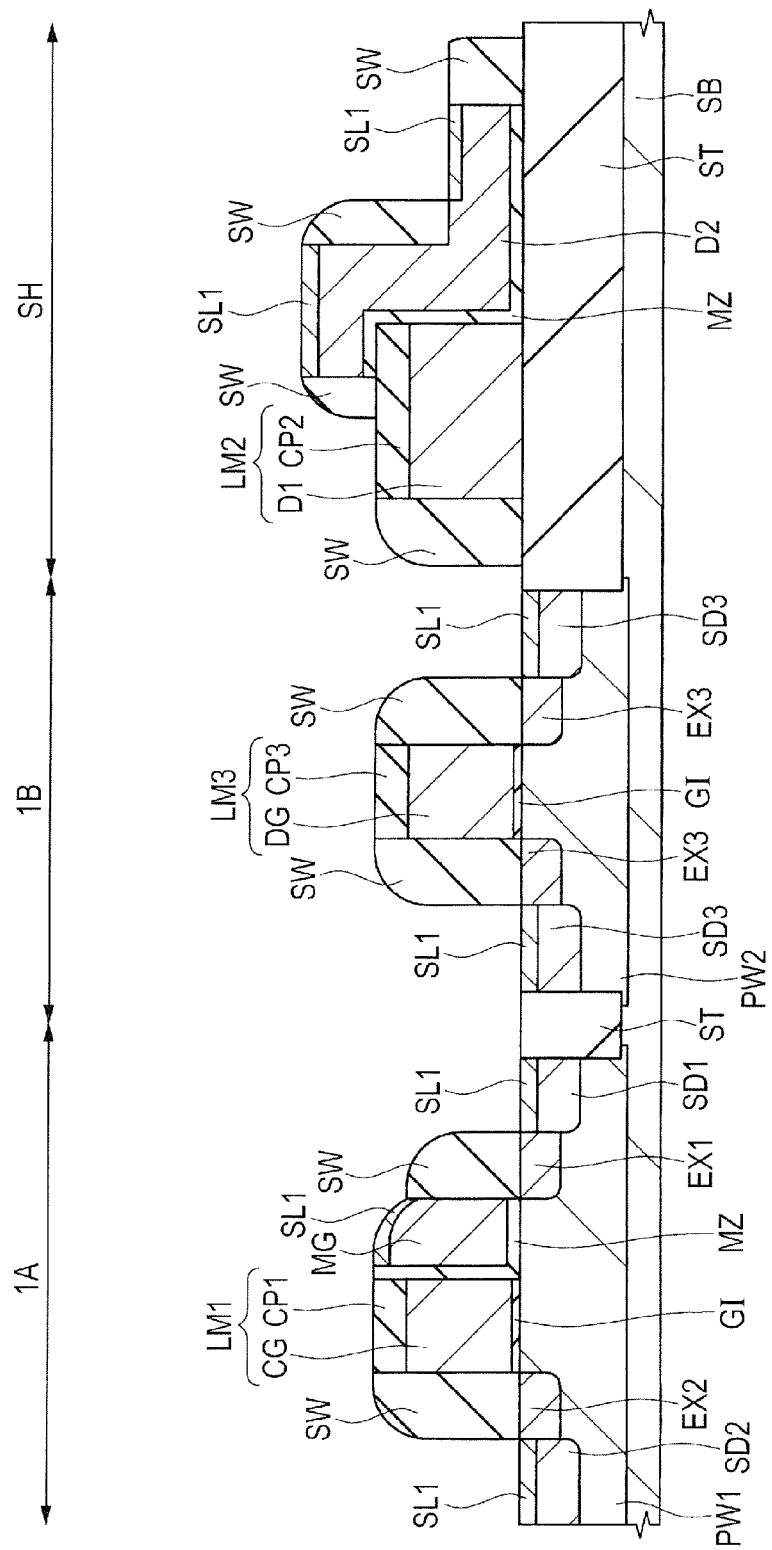
FIG. 14 is a cross-sectional view of an essential part during the manufacturing step of the semiconductor device following FIG. 13.

Next, by subjecting the semiconductor substrate SB to a heat treatment, the upper layer portions (surface layer portions) of each of the n⁺-type semiconductor regions SD1, SD2, SD3, the memory gate electrode MG, and the second electrode D2 are made to react with the metal film. Thus, as shown in FIG. 14, the silicide layers SL1 are formed in the upper part (upper surface, surface, upper layer part) of each of the n⁺-type semiconductor regions SD1, SD2, SD3, the memory gate electrode MG, and the second electrode D2 respectively. The silicide layer SL1 can be made a cobalt silicide layer (when the metal film is a cobalt film), a nickel silicide layer (when the metal film is a nickel film), or a platinum-added nickel silicide layer (when the metal film is a nickel-platinum alloy film) for example. Also, the platinum-added nickel silicide layer means a nickel silicide layer added with platinum namely a nickel silicide layer containing platinum, and can be also called a nickel-platinum silicide layer. Thereafter, a heat treatment can be further executed after removing the metal film not yet reacted by wet etching and the like to lower the resistance of the silicide layer SL1.

By executing a so-called salicide (self-aligned silicide) process thus, the silicide layers SL1 are formed in the upper part of the n⁺-type semiconductor regions SD1, SD2, SD3, the memory gate electrode MG, and the second electrode D2, thereby the resistance of the source and drain can be lowered and the resistance of the memory gate electrode MG and the second electrode D2 (second section) can be lowered.

Next, an insulating film IL3 is formed (laminated) over the entire surface of the main surface of the semiconductor substrate SB as an inter-layer insulating film so as to cover the laminated body LM1, the memory gate electrode MG, the laminated body LM2 and the second electrode D2, the laminated body LM3, and the side wall spacers SW (Step S19 of FIG. 2).

The insulating film IL3 is comprised of a single body film of a silicon oxide film or a laminated film of a silicon nitride film and a silicon oxide film that is formed over the silicon nitride film so as to be thicker than the silicon nitride film, or the like, and can be formed using the CVD method and the like for example.

Figure 15:
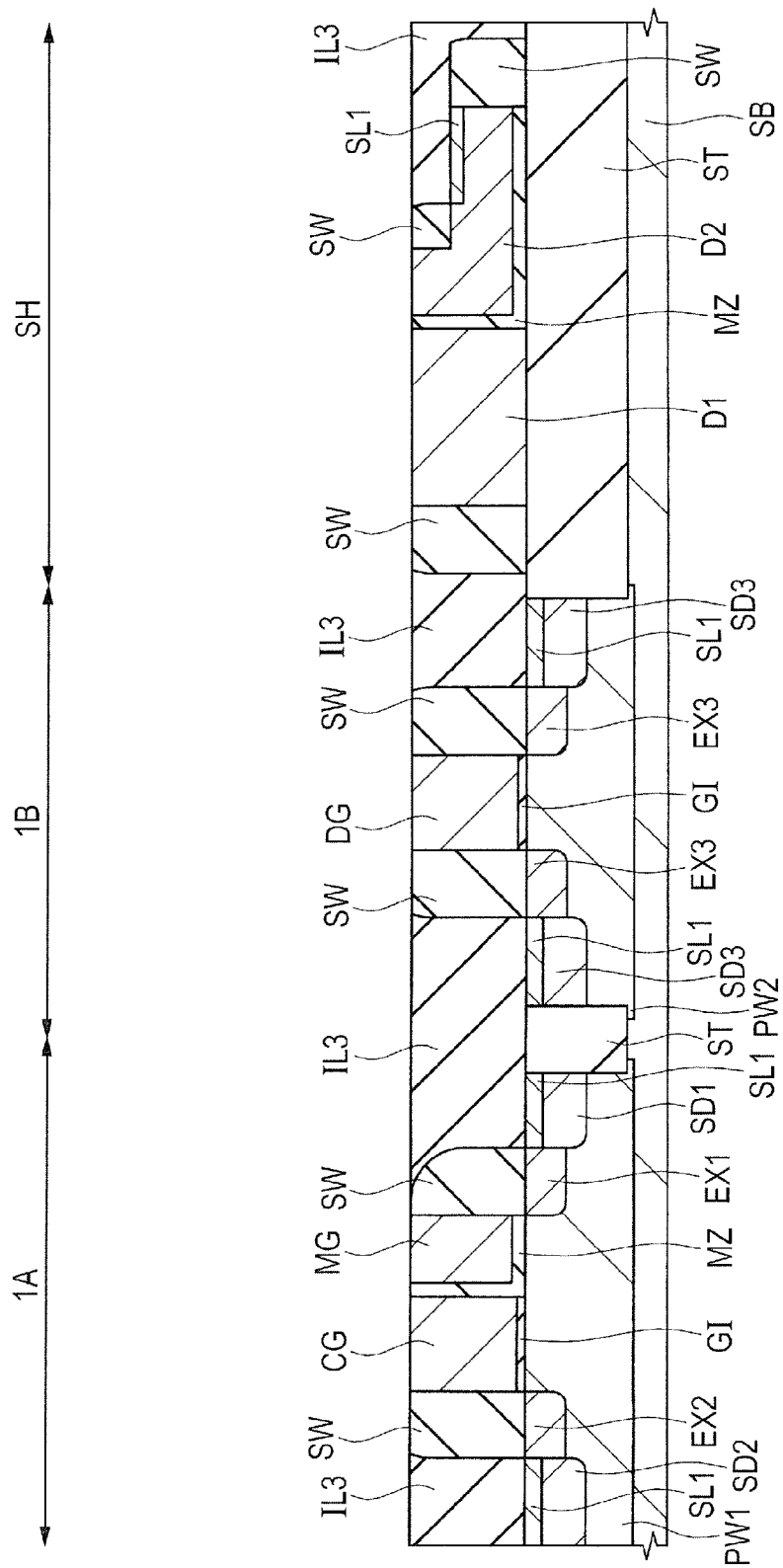
FIG. 15 is a cross-sectional view of an essential part during the manufacturing step of the semiconductor device following FIG. 14.

Next, the upper surface of the insulating film IL3 is subjected to polishing (polishing treatment) using the CMP method and the like (Step S20 of FIG. 2). By the polishing step of Step S20, as shown in FIG. 15, respective upper surfaces of the control gate electrode CG, the memory gate electrode MG, the gate electrode DG, the first electrode D1, and the second electrode D2 are exposed. In other words, in the polishing step of Step S20, the cap insulating films CP1, CP2, CP3 having been formed over the control gate electrode CG, the first electrode D1, and the gate electrode DG are entirely removed. It is a matter of course that a part of the side walls SW positioned over the side walls of the cap insulating films CP1, CP2, CP3 is also removed. Further, the silicide layer SL1 having been formed in the upper part of the memory gate electrode MG is removed. Also, in the shunt region SH, the third section of the second electrode D2 is removed along with the silicide layer SL1, and becomes the second electrode D2 of an L-shape in a cross-sectional view. In other words, the second electrode D2 is comprised of the first section that extends along the side wall of the first electrode D1 and the second section that extends from the first section to over the element separation region ST, and the silicide layer SL1 that has been formed in the surface of the second portion remains without being polished.

Also, at the stage of forming the insulating film IL3 in Step S19, the unevenness or the step that reflects the laminated body LM1, the memory gate electrode MG, the laminated bodies LM2, LM3, the side wall spacers SW, and the like is formed in the upper surface of the insulating film IL3, however, the upper surface of the insulating film IL3 is flattened after the polishing step of Step S20. More specifically, the upper surface of the control gate electrode CG, the upper surface of the memory gate electrode MG, the upper surface of the first electrode D1, the upper surface of the second electrode D2 (the first section), the upper surface of the gate electrode DG, and the upper surface of the insulating film IL3 have a same height from the upper surface of the semiconductor substrate SB or the upper surface of the element separation region ST. Further, the upper surfaces (upper ends) of the side wall spacers SW formed in the control gate electrode CG, the memory gate electrode MG, the gate electrode DG, the first electrode D1, and the first section of the second electrode D2 also have a height equal to the height of the control gate electrode CG and others described above.

Figure 16:
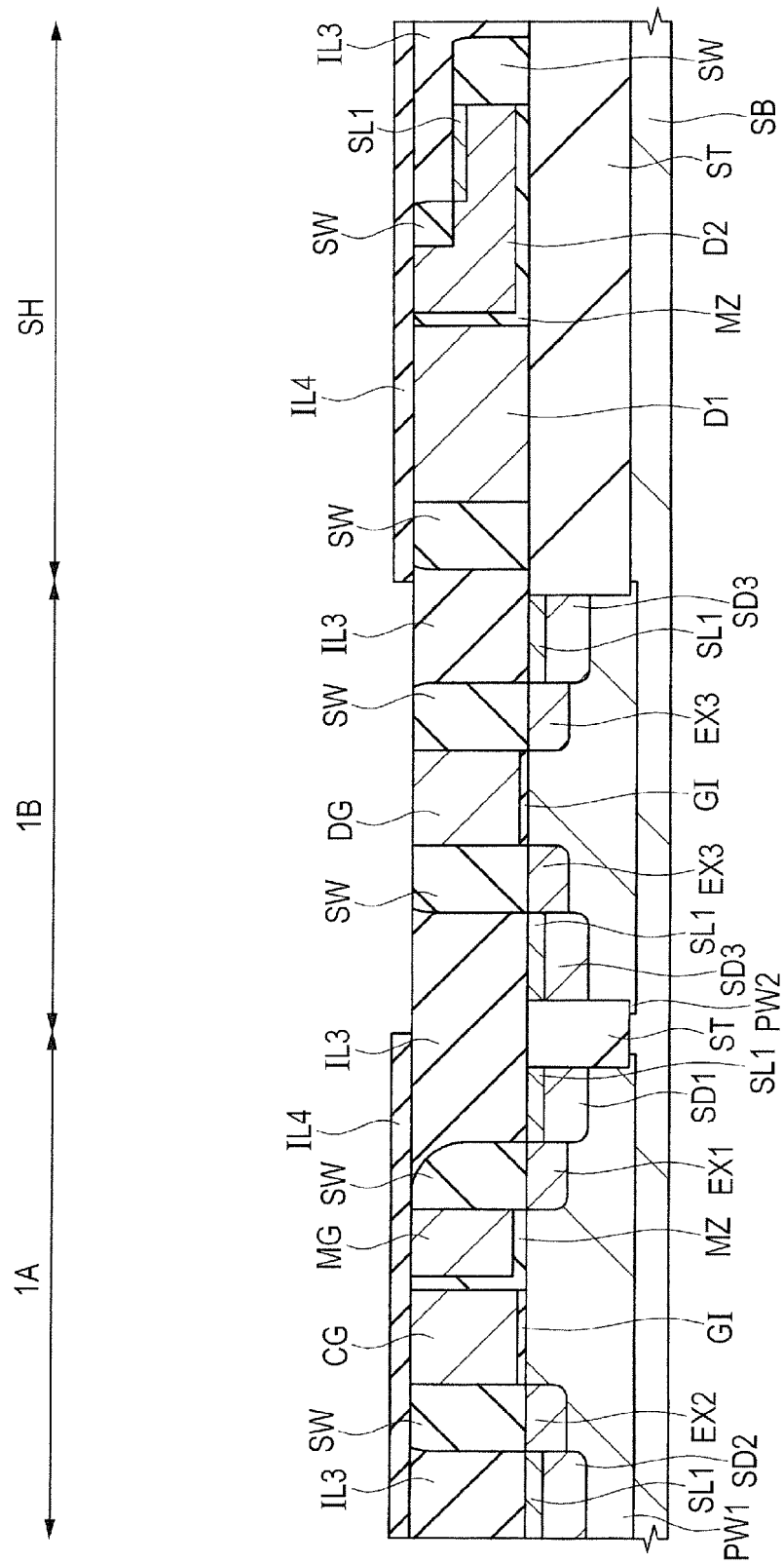
FIG. 16 is a cross-sectional view of an essential part during the manufacturing step of the semiconductor device following FIG. 15.

Next, as shown in FIG. 16, an insulating film IL4 having a predetermined pattern is formed over the semiconductor substrate SB (Step S21 of FIG. 3).

The insulating film IL4 is comprised of a silicon nitride film and the like for example, and can be formed using the CVD method and the like. The insulating film IL4 has a pattern of covering the entire memory cell region 1A and the entire shunt region SH and exposing the gate electrode DG in the peripheral circuit region 1B in a plan view. In other words, the insulating film IL4 has a pattern of covering the control gate electrode CG, the memory gate electrode MG, the first electrode D1, and the second electrode D2, and exposing the gate electrode DG.

Next, the gate electrode DG is etched and removed (Step S22 of FIG. 3). With respect to etching of Step S22, dry etching, or wet etching, or combination of the both can be used.

Because the gate electrode DG has been removed in Step S22, a trench (recess, recessed part) TR1 is formed in the insulating film IL3 (including the side wall spacers SW) that has been subjected to a polishing treatment. The trench TR1 is a region where the gate electrode DG is removed, and corresponds to a region where the gate electrode DG existed until the gate electrode DG was removed. The bottom (bottom surface) of the trench TR1 is formed by the upper surface of the insulating film GI, and the side walls (side surfaces) of the trench TR1 are formed by the side surfaces of the side wall spacers SW (the side surfaces that have contacted the gate electrode DG before removing the gate electrode DG).

In the etching step for the gate electrode DG of Step S22, it is preferable to execute etching with such condition that the insulating film IL4, the insulating film IL3, the insulating film GI, and the side wall spacer SW are hardly etched compared to the gate electrode DG. More specifically, it is preferable to execute etching with such condition that the etching rate of the insulating film IL4, the insulating film IL3, the insulating film GI, and the side wall spacer SW becomes slow compared to the etching rate of the gate electrode DG. Thus, the gate electrode DG can be etched selectively. Because the insulating film IL4 covers the entire memory cell region 1A and the entire shunt region SH, the memory gate electrode MG, the control gate electrode CG, the first electrode D1, and the second electrode D2 are not etched in Step S22.

Figure 17:
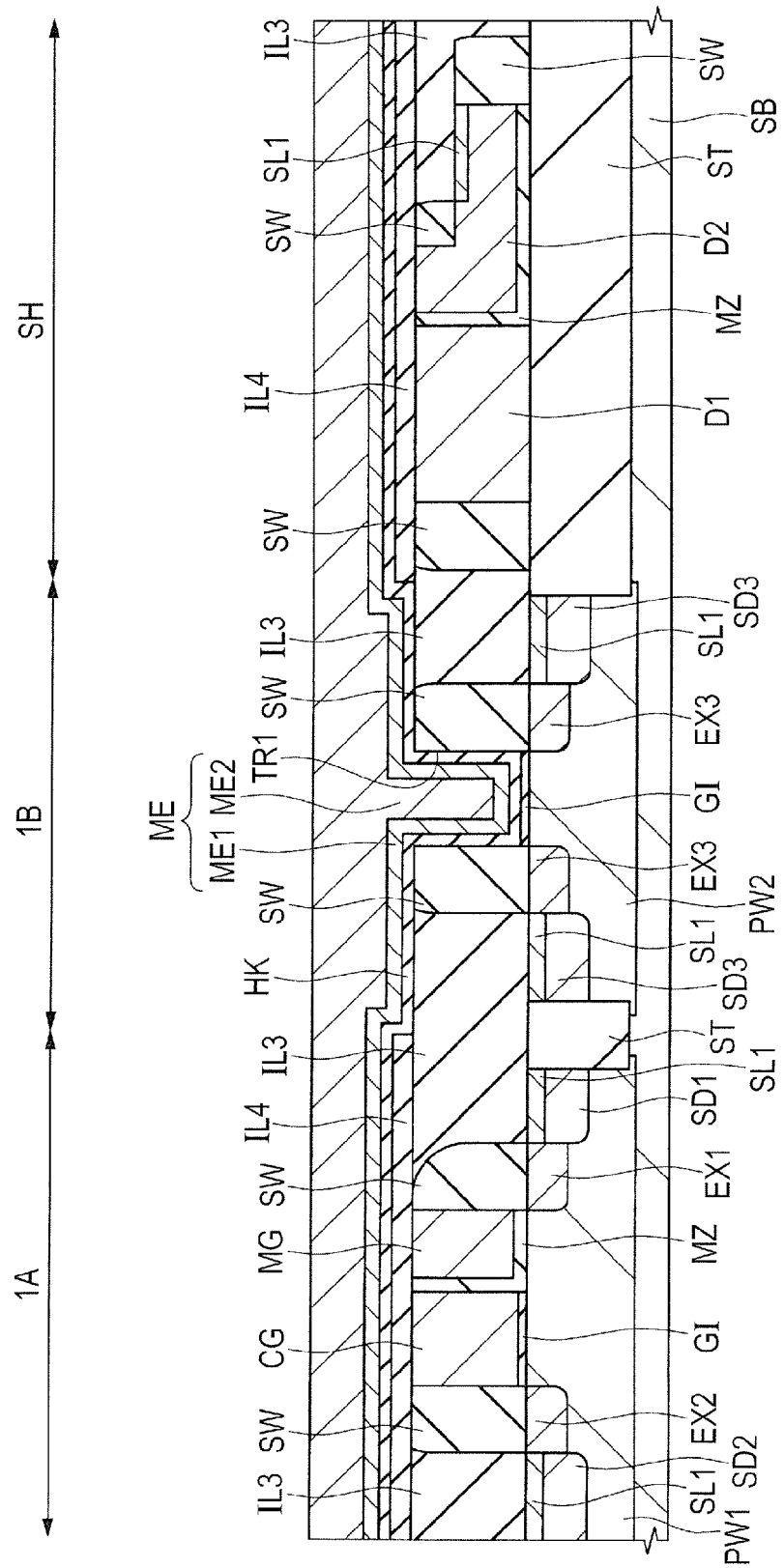
FIG. 17 is a cross-sectional view of an essential part during the manufacturing step of the semiconductor device following FIG. 16.

Next, as shown in FIG. 17, an insulating film HK is formed over the semiconductor substrate SB namely over the insulating film IL3 including the inside (over the bottom and the side walls) of the trench TR1 (Step S24 of FIG. 3). Then, a metal film ME is formed as an electro-conductive film over the semiconductor substrate SB namely over the insulating film HK so as to fill the inside of the trench TR1 (Step S24 of FIG. 3).

In the trench TR1, although the insulating film HK is formed over the bottom (bottom surface) and the side walls (side surfaces) of the trench TR1 in Step S24, the trench TR1 cannot be filled entirely by the insulating film HK. By forming the metal film ME in Step S24, the trench TR1 becomes a state of being entirely filled with the insulating film HK and the metal film ME.

The insulating film HK is an insulating film for the gate insulating film, and the metal film ME is an electro-conductive film for the gate electrode. More specifically, the insulating film HK is an insulating film for the gate insulating film of the MISFET that is formed in the peripheral circuit region 1B, and the metal film ME is an electro-conductive film for the gate electrode of the MISFET that is formed in the peripheral circuit region 1B.

The insulating film HK is an insulating material film or a so-called High-k film (high dielectric constant film) having a higher dielectric constant (specific dielectric constant) compared to silicon nitride. Also, in the present application, the High-k film, high dielectric constant film or high dielectric constant gate insulating film means a film having a higher dielectric constant (specific dielectric constant) compared to silicon nitride.

As the insulating film HK, a metal oxide film such as a hafnium oxide film, zirconium oxide film, aluminum oxide film, tantalum oxide film, or a lanthanum oxide film can be used, and these metal oxide films also can further contain either one or both of nitrogen (N) and silicon (Si). The insulating film HK can be formed by the ALD (atomic layer deposition) method or the CVD method for example. When a high dielectric constant film (the insulating film HK here) is used for the gate insulating film, because the physical film thickness of the gate insulating film can be increased compared to a case of using a silicon oxide film, an advantage of capable of reducing the leak current is secured.

As the metal film ME, a metal film such as a titanium nitride (TiN) film, tantalum nitride (TaN) film, tungsten nitride (WN) film, titanium carbide (TiC) film, tantalum carbide (TaC) film, tungsten carbide (WC) film, tantalum nitride carbide (TaCN) film, titanium (Ti) film, tantalum (Ta) film, titanium aluminum (TiAl) film, or an aluminum (Al) film for example can be used. Also, the metal film mentioned here means an electro-conductive film exhibiting metal conduction, and is to include not only a metal film of a single body (pure metal film) and an alloy film but also a metal compound film exhibiting metal conduction (a metal nitride film, a metal carbide film, and the like). Therefore, the metal film ME is an electro-conductive film exhibiting metal conduction, is not limited to a metal film of a single body (pure metal film) and an alloy film, and may be a metal compound film exhibiting metal conduction (a metal nitride film, a metal carbide film, and the like). Further, although the metal film ME can be comprised of a laminated film (a laminated film in which plural films are laminated), in that case, the lowermost layer of the laminated film is made the metal film (the electro-conductive film exhibiting metal conduction). Also, the laminated film can be comprised of a laminated film of plural metal films (electro-conductive films exhibiting metal conduction). The metal film ME can be formed using the sputtering method and the like for example.

In FIG. 17, as an example suitable to the metal film ME, a case is shown in which the metal film ME is comprised of a laminated film of a titanium aluminum (TiAl) film ME1 and an aluminum (Al) film ME2 over the titanium aluminum film ME1. In this case, in Step S24, after the titanium aluminum film ME1 is formed first over the insulating film HK, the aluminum film ME2 comes to be formed over the titanium aluminum film ME1 so as to fill the inside of the trench TR1. At this time, it is preferable that the aluminum film ME2 is made thicker than the titanium aluminum film ME1. Because the aluminum film ME2 has a low resistance, the resistance of the gate electrode GE formed later can be lowered. Also, by the work function of the material of the portion (the titanium aluminum film ME1 here) that contacts the gate insulating film in the gate electrode GE formed later, the threshold voltage of the MISFET that includes the gate electrode GE can be controlled. Further, from the viewpoint of improving adhesiveness, it is also possible to interpose a titanium (Ti) film, or a titanium nitride (TiN) film, or a laminated film of them between the titanium aluminum film ME1 and the aluminum film ME2. In that case, after the titanium aluminum film ME1 is formed, the titanium film, or the titanium nitride film, or the laminated film of them is formed over the titanium aluminum film ME1, and the aluminum film ME2 thereafter comes to be formed over it.

Figure 18:
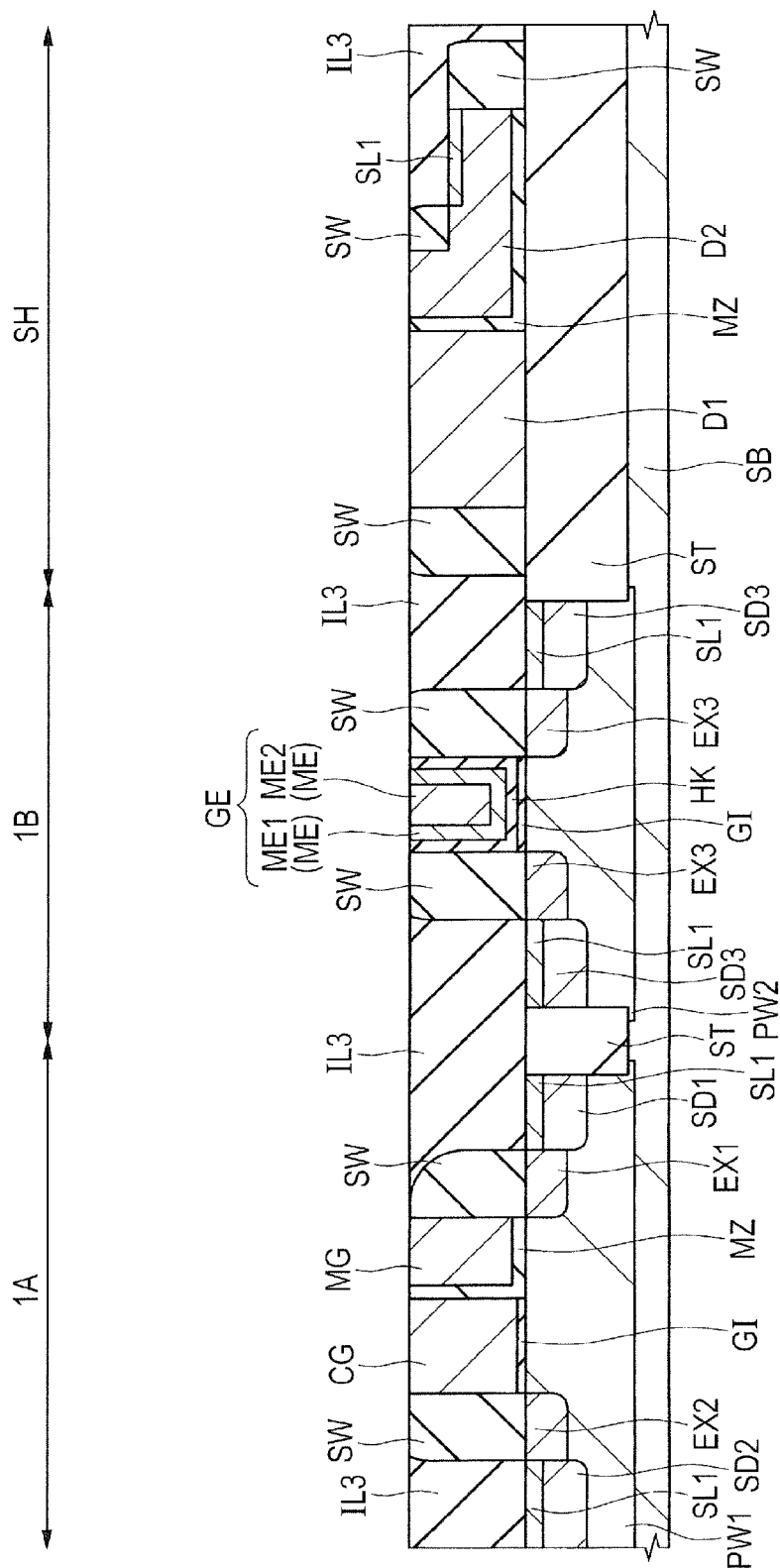
FIG. 18 is a cross-sectional view of an essential part during the manufacturing step of the semiconductor device following FIG. 17.

Next, as shown in FIG. 18, by removing the unnecessary metal film ME and insulating film HK of the outside of the trench TR1 by a polishing treatment such as the CMP method, the insulating film HK and the metal film ME are made to remain inside the trench TR1 (Step S25 of FIG. 3).

In other words, in Step S25, the metal film ME and the insulating film HK of the outside of the trench TR1 are removed, and the insulating film HK and the metal film ME are made to remain in the inside of the trench TR1. Thus, such a state comes up that the insulating film HK and the metal film ME remain and are embedded in the inside of the trench TR1.

The metal film ME embedded in the trench TR1 becomes the gate electrode GE of the MISFET, the insulating film HK embedded in the trench TR1 functions as a gate insulating film of the MISFET, and the gate electrode GE functions as a gate electrode of the MISFET.

Also, because the gate electrode GE is formed using the metal film ME, the gate electrode GE can be made the metal gate electrode. Because the gate electrode GE is made the metal gate electrode, such an advantage is secured that a depletion phenomenon of the gate electrode GE is suppressed, the parasitic capacitance is reduced, and the operation speed of the MISFET can be made fast.

The insulating film HK is formed over the bottom (bottom surface) and the side walls of the trench TR1, and the bottom (bottom surface) and the side walls of the gate electrode GE are adjacent to the insulating film HK. The insulating film GI and the insulating film HK are interposed between the gate electrode GE and the semiconductor substrate SB (the p-type well PW2), and the insulating film HK is interposed between the gate electrode GE and the side wall spacers SW. The insulating films GI, HK right below the gate electrode GE function as the gate insulating films of the MISFET, but function as a high dielectric constant gate insulating film because the insulating film HK is a high dielectric constant film.

Further, in Step S25, the insulating film IL4 also can be polished and removed by the CMP method and the like. Therefore, when Step S25 is executed, from over the memory gate electrode MG, over the control gate electrode CG, over the first electrode D1, and over the second electrode D2 also, the metal film ME and the insulating film HK are removed and the insulating film IL4 is also removed, and therefore the upper surface of the memory gate electrode MG, the upper surface of the control gate electrode CG, the upper surface of the first electrode D1, and the upper surface of the second electrode D2 are exposed.

As another aspect, it is also possible to remove the insulating film GI of the bottom of the trench TR1 after etching the gate electrode DG in Step S22 and before forming the insulating film HK in Step S23. In this case, it is more preferable that, after the insulating film GI of the bottom of the trench TR1 is removed, an interface layer comprised of a silicon oxide film or an oxynitride silicon film is formed over the surface of the semiconductor substrate SB (the p-type well PW2) that is exposed in the bottom of the trench TR1, and the insulating film HK is thereafter formed in Step S23. Thus, the interface layer comprised of a silicon oxide film or an oxynitride silicon film comes to be interposed between (in the interface of) the insulating film HK and the semiconductor substrate SB (the p-type well PW2) of the peripheral circuit region 1B.

At the stage Step S25 of FIG. 3 has been completed, the upper surface of the control gate electrode CG, the upper surface of the memory gate electrode MG, the upper surface of the first electrode D1, the upper surface of the second electrode D2 (the first section), the upper surface of the gate electrode GE, and the upper surface of the insulating film IL3 have a height same to the upper surface of the semiconductor substrate SB or the upper surface of the element separation region ST. Also, the upper surfaces (the upper ends) of the side wall spacers SW formed in the control gate electrode CG, the memory gate electrode MG, the gate electrode GE, the first electrode D1, and the first section of the second electrode D2 also have a height same to the height of the control gate CG and others described above.

Figure 19:
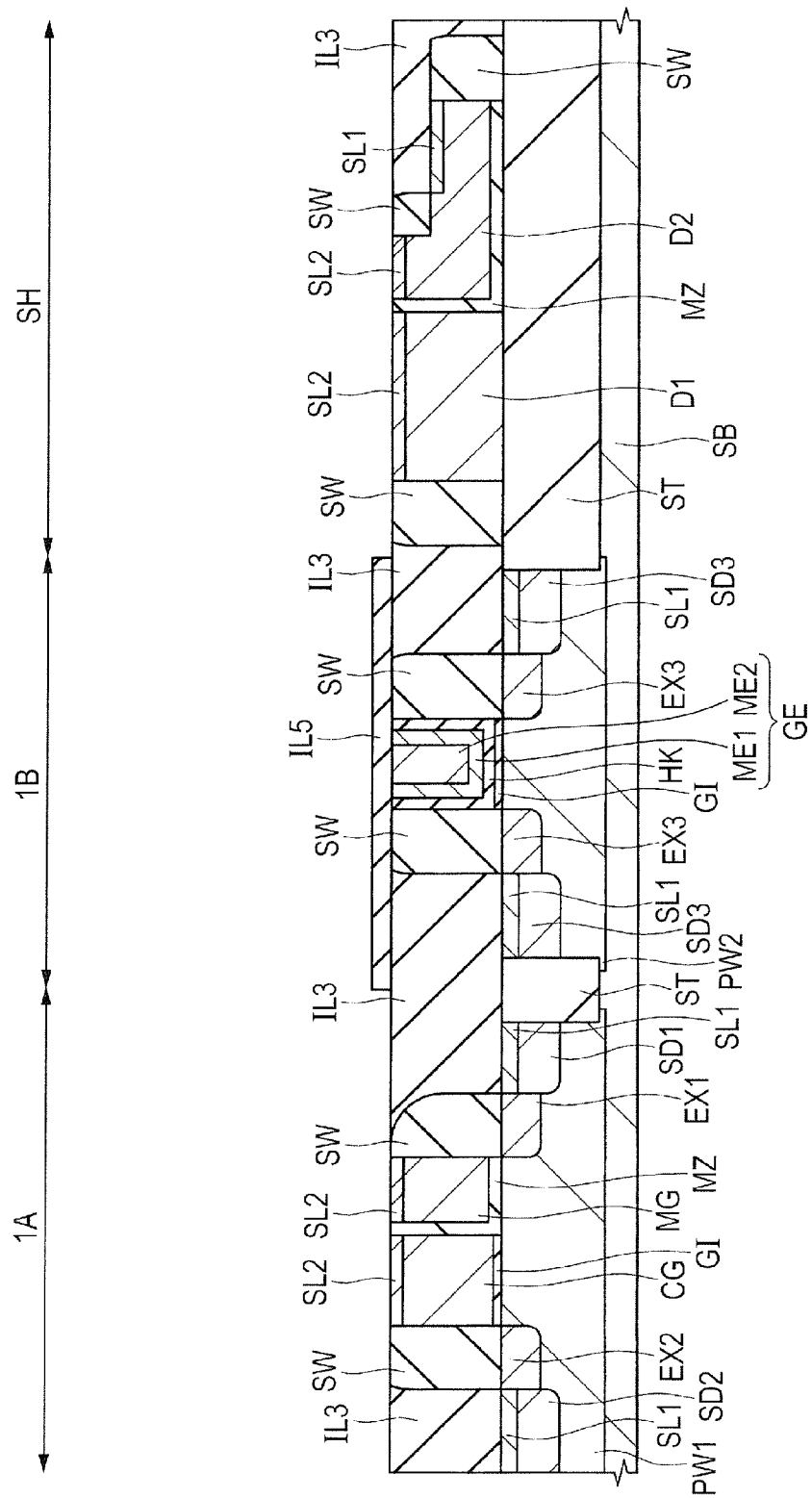
FIG. 19 is a cross-sectional view of an essential part during the manufacturing step of the semiconductor device following FIG. 18.

Next, as shown in FIG. 19, an insulating film IL5 that has a predetermined pattern is formed over the semiconductor substrate SB (Step S26 of FIG. 3).

The insulating film IL5 is comprised of a silicon oxide film and the like for example, and can be formed using the CVD method and the like. The insulating film IL5 has a pattern (plan shape) of covering the entire peripheral circuit region 1B and exposing the memory cell region 1A and the shunt region SH in a plan view. In other words, the insulating film IL5 has a pattern of covering the gate electrode GE of the MISFET and exposing the upper surfaces of the control gate electrode CG, the memory gate electrode MG, the first electrode D1, and the second electrode D2.

Next, as shown in FIG. 19, silicide layers SL2 are formed over the memory gate electrode MG, over the control gate electrode CG, over the first electrode D1, and over the second electrode D2 (Step S27 of FIG. 3). The silicide layers SL2 are formed as follows.

First, a metal film is formed (laminated) over the semiconductor substrate SB. The metal film can be comprised of a metal film of a single body (pure metal film) or an alloy film, preferably a cobalt (Co) film, a nickel (Ni) film, or a nickel-platinum alloy film (platinum-added nickel film), however, the nickel (Ni) film is especially preferable. The metal film can be formed using the sputtering method and the like.

Because the metal film is formed over the entire surface of the main surface of the semiconductor substrate SB, the metal film is formed also over the upper surfaces (surfaces) of the memory gate electrode MG, the control gate electrode CG, the first electrode D1, and the second electrode D2. Therefore, when the metal film is formed, such a state comes up that the upper surface (surface) of the memory gate electrode MG, the upper surface (surface) of the control gate electrode CG, the upper surfaces (surfaces) of the first electrode D1 and the second electrode D2 contact the metal film. On the other hand, in the peripheral circuit region 1B, because the metal film is formed over the insulating film IL5, even when the metal film is formed, the gate electrode GE does not contact the metal film, and such a state comes up that the insulating film IL5 is interposed between the gate electrode GE and the metal film.

Next, by subjecting the semiconductor substrate SB to a heat treatment, the upper layer portions (surface layer portions) of each of the memory gate electrode MG, the control gate electrode CG, the first electrode D1, and the second electrode D2 are made to react with the metal film. Thus, as shown in FIG. 19, the silicide layers SL2 are formed in the upper part (upper surface, surface, upper layer part) of each of the memory gate electrode MG, the control gate electrode CG, the first electrode D1, and the second electrode D2 respectively. The silicide layer SL2 can be preferably comprised of a cobalt silicide layer (when the metal film is a cobalt film), a nickel silicide layer (when the metal film is a nickel film), or a platinum-added nickel silicide layer (when the metal film is a nickel-platinum alloy film). Thereafter, the metal film not yet reacted is removed by wet etching and the like. A cross-sectional view of this stage is shown in FIG. 19. Also, a heat treatment can be further executed after removing the metal film not yet reacted. Further, the silicide layer SL2 is not formed over the gate electrode GE.

By executing a so-called salicide process thus, in the memory cell region 1A, the silicide layers SL2 are formed in the upper part of the memory gate electrode MG and the control gate electrode CG, and thereby the resistance of the memory gate electrode MG and the control gate electrode CG can be lowered. By using the salicide process, the silicide layers SL2 can be formed so as to be self-aligned over the memory gate electrode MG and the control gate electrode CG respectively. Also, the silicide layers SL2 can be formed in the generally entire upper surface of each of the memory gate electrode MG and the control gate electrode CG.

Further, in the shunt region SH, the silicide layers SL2 are formed over the upper surfaces of the first electrode D1 and the second electrode D2, and the resistance of the first electrode D1 and the second electrode D2 can be thereby lowered. Also, in the second electrode D2, the silicide layer SL2 is formed only over the upper surface of the first section.

An example has been shown in which the silicide layers SL2 are formed over the surfaces of the control gate electrode CG, the memory gate electrode MG, and the first electrode D1 as shown in FIG. 19. In other words, the control gate electrode CG and the first electrode D1 have a laminated structure of the silicon film PS1 and the silicide layer SL2, and the memory gate electrode MG has a laminated structure of the silicon film PS2 and the silicide layer SL2. Also, the second electrode D2 has a laminated structure of the silicon film PS2 and the silicide layer SL1 in the second section, and has a laminated structure of the silicon film PS2 and the silicide layer SL2 in the first section. The silicide layer SL1 and the silicide layer SL2 are separated from each other by the side wall SW that is formed in the side wall of the first section.

Figure 20:
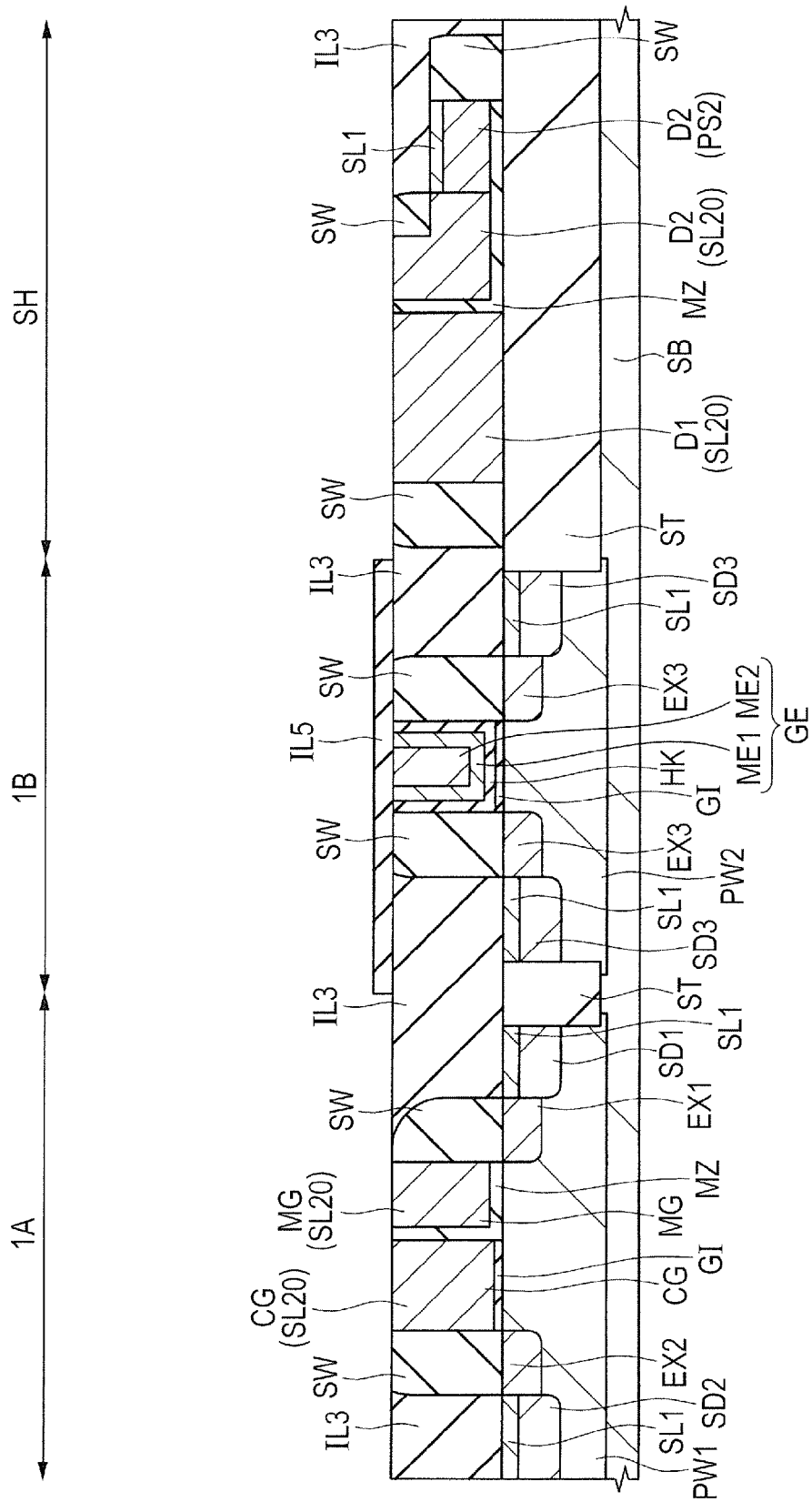
FIG. 20 is a cross-sectional view of an essential part during the manufacturing step of a semiconductor device that is an embodiment other than FIG. 19.

As another aspect, as shown in FIG. 20, it is also possible that a silicide layer SL20 of the first section of the second electrode D2 is formed thick, and the entire silicon film PS2 of the first section is made the silicide layer SL20. In concrete terms, the above can be achieved by increasing the heat treatment time after forming (laminating) the metal film over the silicon film PS2 of the second section in Step S27 of FIG. 3. In this case, the silicon films PS1 of the first electrode D1 and the control gate electrode CG and the silicon film PS2 of the memory gate electrode MG also come to be replaced with the silicide layers 20.

According to the structure of FIG. 20, it can be achieved to lower the resistance of the control gate electrode CG, the memory gate electrode MG, the first electrode D1, and the second electrode D2 in the memory cell region 1A and the shunt region SH.

Figure 21:
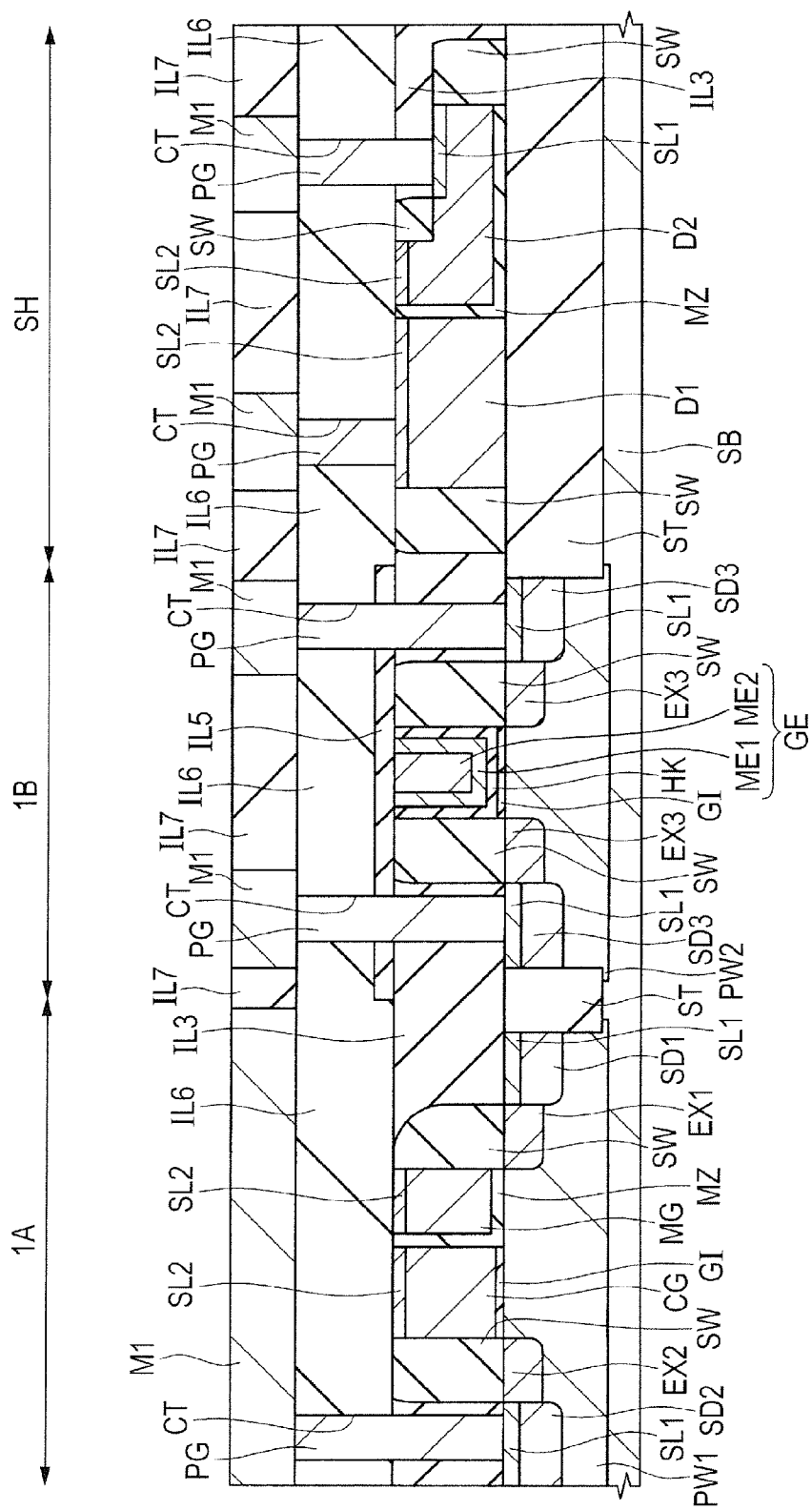
FIG. 21 is a cross-sectional view of an essential part during the manufacturing step of the semiconductor device following FIG. 19.

Next, as shown in FIG. 21, an insulating film (inter-layer insulating film) IL6 is formed over the entire surface of the main surface of the semiconductor substrate SB (Step S28 of FIG. 3).

The insulating film IL6 is formed over the insulating film IL5 in the region where the insulating film IL5 is formed (the peripheral circuit region 1B for example), is formed mainly over the insulating film IL3 in the region where the insulating film IL5 is not formed, and is formed so as to cover the silicide layer SL2 over the memory gate electrode MG and the silicide layer SL2 over the control gate electrode CG in the memory cell region 1A. In the shunt region SH, the insulating film IL6 is formed so as to cover the silicide layer SL2 over the first electrode D1 and the silicide layer SL2 over the second electrode D2. As the insulating film IL6, for example, a silicon oxide system insulating film mainly comprised of silicon oxide can be used.

After forming the insulating film IL6, the upper surface of the insulating film IL6 is polished by the CMP method, and the flatness of the upper surface of the insulating film IL6 is improved.

Also, in the present embodiment, the insulating film IL6 is formed without removing the insulating film IL5. Thus, the manufacturing step of the semiconductor device can be reduced. As another aspect, it is also possible to form the silicide layer SL2 in Step S27, to thereafter remove the insulating film IL5, and to form thereafter the insulating film IL6 in Step S28.

Next, by dry etching the insulating films IL6, IL5, IL3 using a photoresist pattern (not illustrated) formed over the insulating film IL6 using the photolithography method as an etching mask, contact holes (openings, through holes) CT are formed in the insulating films IL6, IL5, IL3 (Step S29 of FIG. 3).

In the region where the insulating film IL5 is formed (the peripheral circuit region 1B for example), the contact holes CT are formed so as to penetrate the laminated film of the insulating film IL6, the insulating film IL5, and the insulating film IL3, whereas in the memory cell region 1A where the insulating film IL5 is not formed, the contact hole CT is formed so as to penetrate the laminated film of the insulating film IL6 and the insulating film IL3. Also, in the shunt region SH where the insulating film IL5 is not formed, the contact hole CT is formed so as to penetrate the insulating film IL6.

Next, as shown in FIG. 21, electro-conductive plugs PG comprised of tungsten (W) and the like are formed as electric conductor sections for coupling in the inside of the contact holes CT (Step S30 of FIG. 3).

In order to form the plug PG, for example, a barrier conductor film (a titanium film, titanium nitride film, or laminated film of them for example) is formed over the insulating film IL6 that includes the inside (over the bottom and the side wall) of the contact hole CT. Then, after forming the main conductor body comprised of the tungsten film and the like over this barrier conductor film so as to fill the contact hole CT, unnecessary main conductor film and barrier conductor film of the outside of the contact hole CT are removed by the CMP method or the etch back method, and the like, and thereby the plug PG can be formed. Also, in order to simplify the drawing, in FIG. 21, the barrier conductor film and the main conductor film (tungsten film) which configure the plug PG are shown integrated.

The contact holes CT and the plugs PG embedded therein are formed in the upper part of the $n^+$-type semiconductor regions SD1, SD2, SD3, the control gate electrode CG, the memory gate electrode MG, the gate electrode GE, the first electrode D1, the second electrode D2 (the second section), and the like. In the bottom of the contact holes CT, a part of the main surface of the semiconductor substrate SB, for example a part of (the silicide layers SL1 over the surface of) the $n^+$-type semiconductor regions SD1, SD2, SD3, a part of (the silicide layer SL2 over the surface of) the control gate electrode CG, a part of (the silicide layer SL2 over the surface of) the memory gate electrode MG, or a part of the gate electrode GE, and the like are exposed. Also, in the bottom of the contact holes CT, a part of (the silicide layer SL2 over the surface of) the first electrode D1, and a part of (the silicide layer SL1 over the surface of) the second section of the second electrode D2 are also exposed.

Further, in the cross-sectional view of FIG. 21, the contact holes CT and the plugs PG that fill the contact holes CT for the $n^+$-type semiconductor regions SD1, SD2, SD3, the first electrode D1, and the second electrode D2 are shown.

Next, wiring (a wiring layer) M1 that is the wiring of the first layer is formed over the insulating film IL6 where the plugs PG are embedded (Step S31 of FIG. 3). A case of forming this wiring M1 using the Damascene technology (the single Damascene technology here) will be explained.

Figure 22:
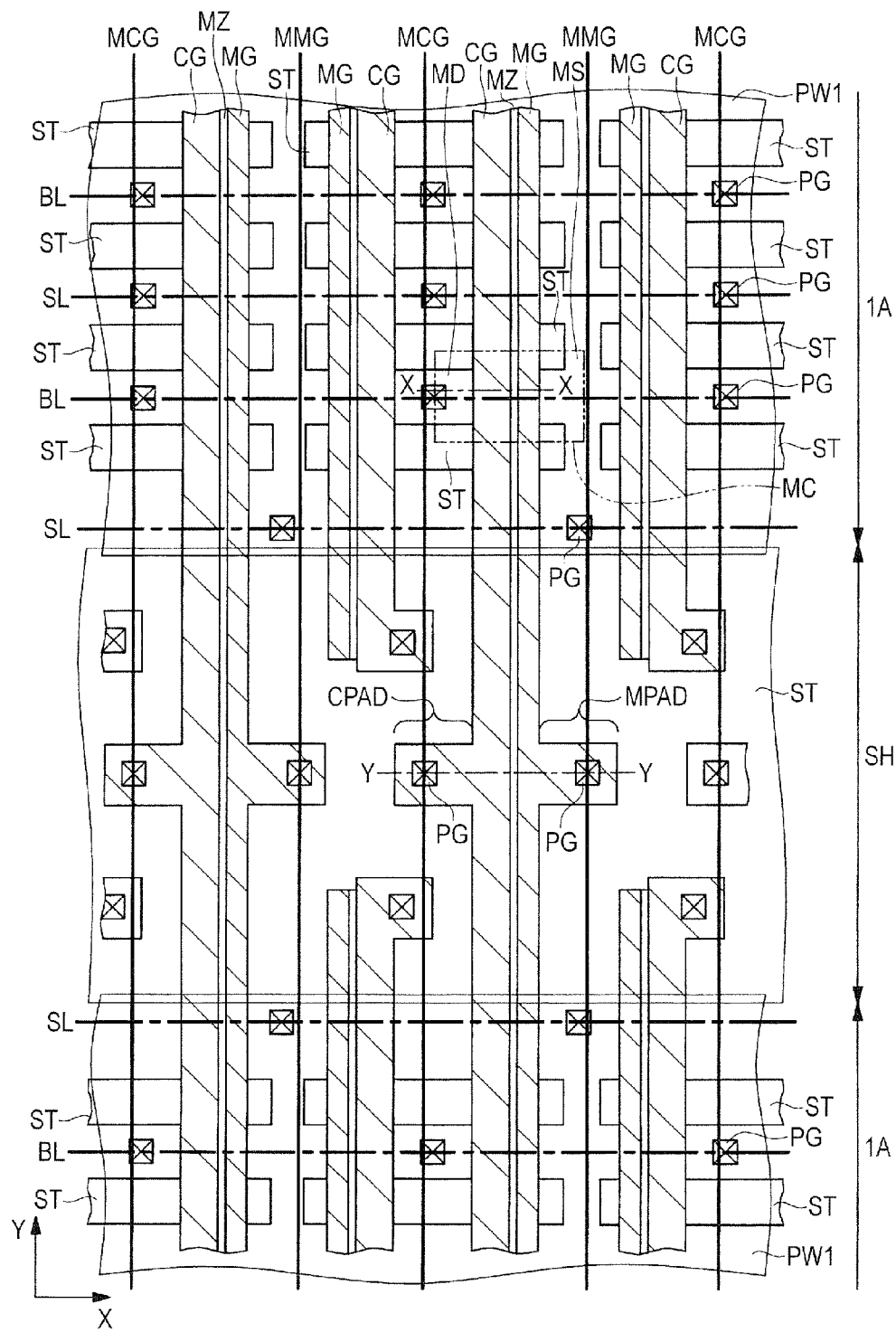
FIG. 22 is a cross-sectional view of an essential part of a semiconductor device that is an embodiment.

First, as shown in FIG. 21, insulating films IL7 are formed over the insulating films IL6 where the plugs PG have been embedded. The insulating film IL7 can be formed also by a laminated film of plural insulating films. Then, after forming wiring trenches (trenches for wiring) in predetermined regions of the insulating films IL7 by dry etching using a photoresist pattern (not illustrated) as an etching mask, barrier conductor films (titanium nitride films, tantalum films, or tantalum nitride films, and the like for example) are formed over the insulating films IL7 including over the bottom and the side walls of the wiring trenches. Then, a seed layer of copper is formed over the barrier conductor film by the CVD method or the sputtering method and the like, a copper plating film is further formed over the seed layer using the electrolytic plating method and the like, and the inside of the wiring trench is filled with the copper plating film. Then, the main conductor film (the copper plating film and the seed layer) and the barrier conductor film of the region other than the wiring trench are removed by the CMP method, and the wiring M1 of the first layer is formed whose main electro-conductive material is the copper embedded in the wiring trench. In FIG. 22, in order to simplify the drawing, the wiring (metal wiring) M1 is shown integrating the barrier conductor film, the seed layer, and the copper plating film.

The wiring M1 is electrically coupled with the source region (the $n^+$-type semiconductor region SD1) of the memory transistor, the drain region (the $n^+$-type semiconductor region SD2) of the control transistor, the source/drain region (the $n^+$-type semiconductor regions SD3) of the MISFET of the peripheral circuit region 1B, the control gate electrode CG, the memory gate electrode MG, the gate electrode GE, the first electrode D1, or the second electrode D2, and the like through the plugs PG. Thereafter, the wiring (metal wiring) of the second layer and onward is formed by the dual Damascene method and the like, however, illustration and explanation thereof will be omitted here. Also, the wiring M1 and the wiring of the layers upper than it are not limited to the Damascene wiring, can be also formed by patterning an electric conductor film for wiring, and can be also made tungsten wiring or aluminum wiring and the like for example.

The semiconductor device of the present embodiment is manufactured as described above.

<On Structure of Semiconductor Device>

Next, a configuration of a memory cell of a non-volatile memory in the semiconductor device of the present embodiment will be explained referring to FIG. 22 and FIG. 23.

Figure 23:
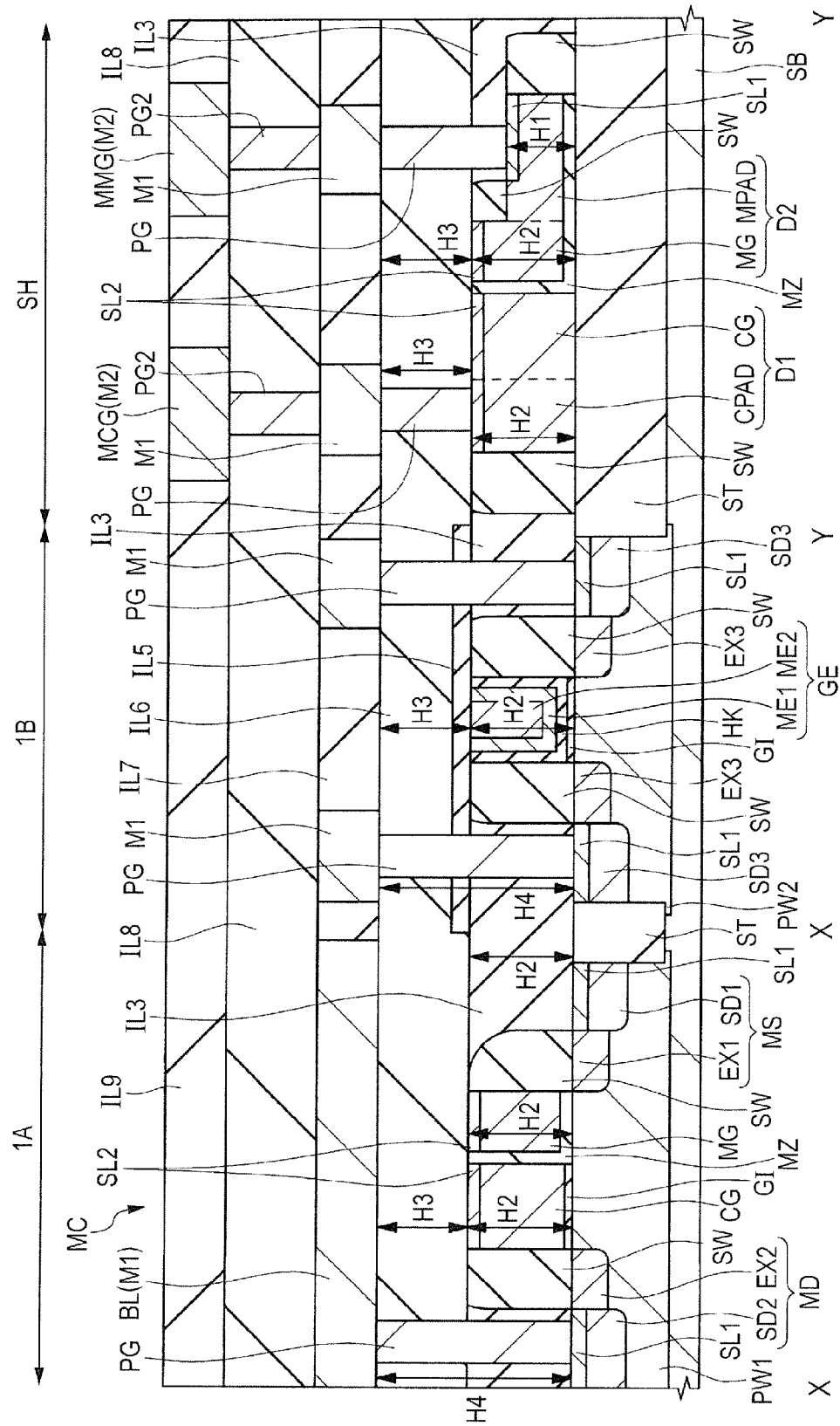
FIG. 23 is a cross-sectional view of an essential part of a semiconductor device that is an embodiment.

FIG. 22 is a cross-sectional view of an essential part of the memory cell region and the shunt region of the semiconductor device of the present embodiment, and FIG. 23 is a cross-sectional view of an essential part of the memory cell region 1A, the peripheral circuit region 1B, and the shunt region SH. The cross-sectional view of the essential part along the line X-X of FIG. 22 is shown in the memory cell region 1A, the cross-sectional view of the essential part along the line Y-Y of FIG. 22 is shown in the shunt region SH, and the cross-sectional view of the essential part of the MISFET similar to FIG. 21 is shown in the peripheral circuit region 1B. In FIG. 23, insulating films IL8, IL9, wiring (metal wiring) M2 of the second layer, and the plugs PG between the wiring M1 and the wiring M2 are added with respect to FIG. 21. In other words, the memory cell region 1A of the cross-sectional view of the essential part of FIG. 4 to FIG. 21 corresponds to the cross-sectional view of the essential part along the line X-X of FIG. 22, and the shunt region SH corresponds to the cross-sectional view of the essential part along the line Y-Y of FIG. 22. In FIG. 22, the side wall spacers SW are omitted.

The structure of the memory cell region 1A and the shunt region SH will be explained referring to FIG. 22 and FIG. 23.

As shown in FIG. 23, in the semiconductor substrate SB, memory cells MC of non-volatile memories comprised of the memory transistor and the control transistor are formed. In each of the memory cell, the MISFET that includes the gate insulating film including an electric charge storage section (an electric charge storage layer) and the memory gate electrode MG is called a memory transistor, and the MISFET that includes the gate insulating film and the control gate electrode CG is called a control transistor.

As shown in FIG. 23, the memory cell MC of a non-volatile memory includes n-type semiconductor regions MS, MD for the source and the drain formed inside the p-type well PW1 of the semiconductor substrate SB, the control gate electrode CG formed in the upper part of the semiconductor substrate SB (the p-type well PW1), and the memory gate electrode MG formed in the upper part of the semiconductor substrate SB (the p-type well PW1) and adjacent to the control gate electrode CG. Also, the memory cell MC of a non-volatile memory further includes the insulating film (gate insulating film) GI formed between the control gate electrode CG and the semiconductor substrate SB (the p-type well PW1), and the insulating film MZ formed between the memory gate electrode MG and the semiconductor substrate SB (the p-type well PW1).

The control gate electrode CG and the memory gate electrode MG are disposed side by side in a state of interposing the insulating film MZ between the opposing side surfaces of them, and extend along the main surface of the semiconductor substrate SB. The extending direction of the control gate electrode CG and the memory gate electrode MG is the perpendicular direction of the paper surface of FIG. 23 (the Y-direction of FIG. 22). The control gate electrode CG and the memory gate electrode MG are formed in the upper part of the semiconductor substrate SB (the p-type well PW1) between the semiconductor region MD and the semiconductor region MS, the memory gate electrode MG is positioned on the semiconductor region MS side through the insulating film GI and the insulating film MZ, and the control gate electrode CG is positioned on the semiconductor region MD side. However, the control gate electrode CG is formed over the semiconductor substrate SB through the insulating film GI, and the memory gate electrode MG is formed over the semiconductor substrate SB through the insulating film MZ.

The control gate electrode CG and the memory gate electrode MG are adjacent to each other with the insulating film MZ being interposed in between. The insulating film MZ extends over both regions of the region between the memory gate electrode MG and the semiconductor substrate SB (the p-type well PW1), and the region between the memory gate electrode MG and the control gate electrode CG.

The semiconductor region MS and the semiconductor region MD are semiconductor regions for the source or the drain. More specifically, the semiconductor region MS for the source includes the $n^-$-type semiconductor region EX1 (extension region) and the $n^+$-type semiconductor region SD1 (source region) that has a higher impurities concentration compared to the $n^-$-type semiconductor region EX1. Also, the semiconductor region MD for the drain includes the $n^-$-type semiconductor region EX2 (extension region) and the $n^+$-type semiconductor region SD2 (drain region) that has a higher impurities concentration compared to the $n^-$-type semiconductor region EX2.

In the upper part of the n+-type semiconductor regions SD1, SD2, the silicide layers SL1 are formed by the salicide technology and the like. In the upper part of the memory gate electrode MG and the upper part of the control gate electrode CG, the silicide layers SL2 are formed by the salicide technology and the like.

As shown in FIG. 22, in the memory cell region 1A, the plural memory cells MC are disposed in the matrix shape in the X-direction and the Y-direction, and each memory cell MC is electrically separated by the element separation region ST adjacent thereto in the Y-direction. The two memory cells MC adjacent to each other in the X-direction include the common semiconductor region MD for the drain, and the common semiconductor region MD for the drain is coupled with a bit line BL that extends in the X-direction. The bit line BL is comprised of the wiring M1 of the first layer for example. The semiconductor region MS for the source that is disposed on the opposite side of the common semiconductor region MD for the drain with respect to the control gate electrode CG and the memory gate electrode MG is formed to be continuous in the Y-direction, and is coupled with a source line SL through the plug PG at an end of the memory cell region 1A. The source line SL is comprised of the wiring M1 of the first layer for example, and extends in the X-direction.

Also, the control gate electrode CG is formed to be common to (integrated with) the plural memory cells MC that are arrayed in the Y-direction, and extends in the Y-direction. The memory gate electrode MG is formed to be common to (integrated with) the plural memory cells MC that are arrayed in the Y-direction, and extends in the Y-direction. Between the 2 memory cell regions 1A, the shunt region SH is disposed. The control gate electrode CG and the memory gate electrode MG extending continuously over the 2 memory cell regions 1A adjacent to each other and the shunt region SH are coupled with control gate wiring MCG and memory gate wiring MMG respectively in the shunt region SH. The control gate wiring MCG and the memory gate wiring MMG are comprised of the wiring M2 of the second layer for example, and extend in the Y-direction.

The control gate electrode CG extends in the Y-direction with a predetermined width, and includes a pad (projection) CPAD that extends in the X-direction in the shunt region SH. Also, the control gate electrode CG is coupled with the control gate wiring MCG through the plug PG formed over the pad CPAD. The pad CPAD projects to the opposite direction of the memory gate electrode MG that is adjacent to the control gate electrode CG through the insulating film MZ. As shown in FIG. 23, the first electrode D1 of the shunt region SH is comprised of the control gate electrode CG and the pad CPAD, and is coupled with the wiring (metal wiring) M2 (the control gate wiring MCG) of the second layer through the plug PG formed over the pad CPAD, the wiring M1 of the first layer, and a plug PG2.

The memory gate electrode MG is formed over the side wall of the control gate electrode CG, extends in the Y-direction with a predetermined width, and includes a pad (projection) MPAD that extends in the X-direction in the shunt region SH. Also, the memory gate electrode MG is coupled with the memory gate wiring MMG through the plug PG that is formed over the pad MPAD. The pad MPAD projects to the opposite direction of the control gate electrode CG that is adjacent to the memory gate electrode MG through the insulating film MZ. As shown in FIG. 23, the second electrode D2 of the shunt region SH is comprised of the memory gate electrode MG and the pad MPAD, and is coupled with the wiring (metal wiring) M2 (the memory gate wiring MMG) of the second layer through the plug PG formed over the pad MPAD, the wiring M1 of the first layer, and the plug PG2. In the explanation of the manufacturing method and the like described above, the first section of the second electrode D2 corresponds to the memory gate electrode MG, and the second section corresponds to the pad MPAD.

The control gate wiring MCG and the memory gate wiring MMG only have to extend in the direction same as the extending direction of the control gate electrode CG and the memory gate electrode MG, and may be formed by wiring of different layers.

Also, in FIG. 23, the MISFET of the peripheral circuit region 1B is as per the explanation of the manufacturing method described above.

In FIG. 23, the upper surface of the control gate electrode CG including the silicide layer SL2, the upper surface of the memory gate electrode MG including the silicide layer SL2, the upper surface of the first electrode D1 including the silicide layer SL2, the upper surface of the second electrode D2 (the first section) including the silicide layer SL2, the upper surface of the gate electrode GE, and the upper surface of the insulating film IL3 have a same height (H2) from the upper surface of the semiconductor substrate SB or the upper surface of the element separation region ST. Further, the upper surface (upper end) of the side wall spacers SW formed in the control gate electrode CG, the memory gate electrode MG, the gate electrode GE, the first electrode D1, and the first section of the second electrode D2 has a same height as the height (H2) of the control gate electrode CG and others described above. Also, a height (H1) of the upper surface of the second section of the second electrode D2 including the silicide layer SL1 is lower the height (H2) of the upper surface of the first section of the second electrode D2 including the silicide layer SL2.

Further, because the upper surface of the insulating film IL6 is polished by the CMP method after forming the insulating film IL6 in Step S28 of FIG. 3, in the memory cell region 1A, the peripheral circuit region 1B, and the shunt region SH, the height from the upper surface of the semiconductor substrate SB or the upper surface of the element separation region ST to the upper surface of the insulating film IL6 is same. In other words, a height (H3) from the upper surface of the control gate electrode CG or the memory gate electrode MG including the silicide layer SL2 to the upper surface of the insulating film IL6, a height (H3) from the upper surface of the gate electrode GE to the upper surface of the insulating film IL6, and a height (H3) from the upper surface of the first electrode D1 or the second electrode D2 including the silicide layer SL2 to the upper surface of the insulating film IL6 are same to each other. Here, the term of same height means that the height becomes same by the polishing treatment. Therefore, the term is used with the meaning including a height dispersion that depends on the location of the polishing treatment surface for example, and therefore the term can be interpreted as "generally same height".

Also, a height (H4) of the upper surface of the insulating film IL6 (in other words, the lower surface of the wiring M1) from the upper surface of the silicide layer SL1 formed over the surface of the semiconductor region MD for the drain of the memory cell MC is same as a height (H4) of the upper surface of the insulating film IL6 (in other words, the lower surface of the wiring M1) from the upper surface of the silicide layer SL1 formed over the surface of the source/drain region of the MISFET. Here, the height (H4) can be interpreted also to be the height of the plug PG coupled to the silicide layer SL1 or the depth of the contact hole CT.

<On Main Feature and Effect>

Next, the main feature and effect of the present embodiment will be explained.

In the semiconductor device of the present embodiment, in the shunt region SH, the second electrode D2 that is integral with the memory gate electrode MG does not overhang on the upper surface of the first electrode D1 that is integral with the control gate electrode CG, and the upper surface of the first section of the second electrode D2 has a same (generally same) height as the upper surface of the first electrode D1. Therefore, the height of the lower surface of the wiring M1 that is formed over the control gate electrode CG, the memory gate electrode MG, the first electrode D1, and the second electrode D2 through the insulating film IL6 with respect to the upper surface of the semiconductor substrate SB can be reduced. In other words, the height (H4) of the plug PG that is coupled with the semiconductor region MD for the drain of the memory cell MC in the memory cell region 1A (the depth of the contact hole CT) can be lowered, therefore the coupling reliability between the wiring M1 and the semiconductor region MD for the drain can be improved, and the manufacturing yield of the plug PG and the contact hole CT can be improved. When it is assumed that the second electrode D2 in the shunt region SH has a structure of overhanging on the upper surface of the first electrode D1, the height of the lower surface of the wiring M1 with respect to the upper surface of the semiconductor substrate SB becomes high by the portion of the film thickness of the second electrode D2. Also, because the height of the plug PG (the depth of the contact hole CT) increases, the coupling reliability between the wiring M1 and the semiconductor region MD for the drain deteriorates, and the manufacturing yield of the contact hole CT and the plug PG deteriorates. The plug PG coupled with the source/drain region of the MISFET of the peripheral circuit region 1B also has a similar effect because, with respect to the distance between the second electrode D2 and the wiring M1 (namely the film thickness of the insulating film IL6), a predetermined film thickness is necessary in order to secure the withstand voltage between the both.

Also, in the shunt region SH, because the height (H2) of the upper surface of the first electrode D1 and the height (H2) of the upper surface of the second electrode D2 are same (generally same), the coupling reliability between the second electrode D2 (in other words, the memory gate electrode MG) and the memory gate wiring MMG can be improved, and the dispersion in the shape of the second electrode D2 among the plural memory gate electrodes MG can be reduced. For example, in the present embodiment, it is not necessary to worry about such dispersion in the shape of the second electrode D2 (the dispersion in the height of the first section) as shown in FIG. 90 to FIG. 94 of Japanese Unexamined Patent Application Publication No. 2011-222938.

Also, because the silicide layer SL2 is formed over the upper surface of the first section of the second electrode D2 and the silicide layer SL1 is formed over the upper surface of the second section in the shunt region SH, the resistance of the second electrode can be reduced, and high speed operation of the semiconductor device becomes possible.

The method for manufacturing the semiconductor device of the present embodiment includes the steps of, in the shunt region SH, forming the first electrode D1 that is integral with the control gate electrode CG over the semiconductor substrate SB, forming the second electrode D2 that is integral with the memory gate electrode MG so as to be continuous along the upper surface and the side surface of the first electrode D1 and the element separation region ST, and removing the third section of the second electrode D2 positioned over the upper surface of the first electrode D1 using a polishing treatment and exposing the upper surface of the first electrode D1 and the upper surface of the first section of the second electrode D2 that lines the side wall of the first electrode D1. Because the second electrode D2 having a same height as the first electrode D1 is formed by the polishing treatment, the dispersion in the shape can be reduced compared to the working of the second electrode using the wet etching method shown in FIG. 90 to FIG. 94 of Japanese Unexamined Patent Application Publication No. 2011-222938.

Also, the step for removing the third section of the second electrode D2 can be executed combined with a step for forming a replacement gate electrode which is a step for forming the MISFET that is formed in the peripheral circuit region 1B, and therefore it can be achieved without increasing the manufacturing step.

Further, in the method for manufacturing the semiconductor device of the present embodiment, after forming the control gate electrode CG that extends in the first direction in the memory cell region 1A and forming the first electrode D1 that is integral with the control gate electrode CG in the shunt region SH, the silicon film PS2 is laminated so as to cover the control gate electrode CG and the first electrode D1, the silicon film PS2 is subjected to anisotropic dry etching, and the memory gate electrode MG is formed along the side wall of the control gate electrode CG. Prior to the anisotropic dry etching, the photoresist pattern (mask film) that covers a part of the upper surface of the first electrode D1 and covers the second electrode D2 forming region extending in the second direction perpendicular to the first direction that is the extending direction of the control gate electrode CG is formed over the silicon film PS2 of the shunt region SH.

Therefore, accompanying miniaturization of the semiconductor device, even if thinning of the film thickness of the silicon film PS2 for forming the memory gate electrode MG proceeds, the second electrode D2 can be formed highly precisely, and the reliability of the semiconductor device can be improved. For example, in Japanese Unexamined Patent Application Publication No. 2006-054292, it is disclosed that, in the shunt region SH, an isolated auxiliary pattern is arranged adjacent to the control (selection) gate electrode CG, the silicon film PS2 for forming the memory gate electrode MG is thereafter subjected to anisotropic dry etching, the wiring sections that continue to the side walls of the control gate electrode CG and the auxiliary pattern are formed, and the contact to the memory gate wiring is secured by these wiring sections. However, according to the method of Japanese Unexamined Patent Application Publication No. 2006-054292, when thinning of the silicon film PS2 proceeds, there is a possibility that the wiring sections that continue to the side walls of the control gate electrode CG and the auxiliary pattern cannot be formed.

Although the invention achieved by the present inventors has been explained above specifically based on the embodiments, it is needless to mention that the present invention is not limited to the embodiments and various alterations are possible within a scope not deviating from the substances thereof.

What is claimed is:

1. A semiconductor device, comprising:
a semiconductor substrate that includes, in the main surface of the semiconductor substrate, a memory cell region and a shunt region that is adjacent to the memory cell region in the first direction of the main surface;
a memory cell that is formed in the memory cell region, the memory cell including a first gate electrode formed over the main surface of the semiconductor substrate over a first gate insulating film and extending in the first direction, a second gate electrode adjacent to the first gate electrode and formed over the main surface of the semiconductor substrate over a second gate insulating film, and a first source region and a first drain region formed in the main surface of the semiconductor substrate so as to sandwich the first gate electrode and the second gate electrode;
a first electrode positioned in the shunt region and formed integrally with the first gate electrode;
a second electrode positioned in the shunt region, formed integrally with the second gate electrode, and including a first section that is formed along the side wall of the first gate electrode and a second section that extends from the first section along the main surface of the semiconductor substrate;
a first insulating film that covers the first gate electrode, the second gate electrode, the first electrode, and the second electrode;
an electro-conductive first plug coupled with the first drain region and an electro-conductive second plug coupled with the second electrode, the first plug and the second plug being formed in the first insulating film;
first metal wiring coupled with the first plug and second metal wiring coupled with the second plug, the first metal wiring and the second metal wiring being positioned over the first insulating film; and
a second insulating film that is positioned between the main surface of the semiconductor substrate and the first insulating film, covers the side surface of the first gate electrode, the side surface of the second gate electrode, and the side surface of the first electrode, and has a flat upper surface,
wherein the second electrode is positioned on the outer side of the first electrode in a plan view,
wherein the height of the upper surface of the first electrode with respect to the main surface of the semiconductor substrate is same as the height of the upper surface of the first section of the second electrode with respect to the main surface of the semiconductor substrate, and
wherein the height of the upper surface of the second insulating film is same as the height of the upper surface of the first electrode with respect to the main surface of the semiconductor substrate.

2. The semiconductor device according to claim 1,
wherein the second plug is coupled with the upper surface of the second section of the second electrode, and
wherein the upper surface of the second section is lower than the upper surface of the first section with respect to the main surface of the semiconductor substrate.

3. The semiconductor device according to claim 1,
wherein the height of the upper surface of the first gate electrode is same as the height of the upper surface of the first electrode with respect to the main surface of the semiconductor substrate.

4. The semiconductor device according to claim 1, further comprising:
a first silicide layer formed over the upper surface of the second section of the second electrode; and
a second silicide layer formed over the upper surface of the first section of the second electrode.

5. The semiconductor device according to claim 4, further comprising:
an insulative side wall spacer formed over the side wall of the first section,
wherein the first silicide layer and the second silicide layer are separated from each other by the side wall spacer.

6. The semiconductor device according to claim 4,
wherein the first silicide layer and the second silicide layer are in contact with each other.

7. The semiconductor device according to claim 1,
wherein the main surface of the semiconductor substrate includes a peripheral circuit region that is different from the memory cell region and the shunt region,
wherein, in the peripheral circuit region, a MISFET is formed which includes a third gate electrode formed over the main surface of the semiconductor substrate through a third gate insulating film, and a second source region and a second drain region formed in the main surface of the semiconductor substrate so as to sandwich the third gate electrode,
wherein the third gate insulating film is comprised of a film that has a specific dielectric constant higher than that of the second gate insulating film, and
wherein the third gate electrode is comprised of a metal film.

* * * * *